US011769437B2

(12) United States Patent
Feng et al.

(10) Patent No.: US 11,769,437 B2
(45) Date of Patent: *Sep. 26, 2023

(54) SHIFT-REGISTER UNIT CIRCUIT, GATE-DRIVING CIRCUIT, DISPLAY APPARATUS, AND DRIVING METHOD

(71) Applicants: Hefei Xinsheng Optoelectronics Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/819,215

(22) Filed: Aug. 11, 2022

(65) Prior Publication Data

US 2022/0383792 A1 Dec. 1, 2022

Related U.S. Application Data

(63) Continuation of application No. 16/612,947, filed as application No. PCT/CN2019/093721 on Jun. 28, 2019, now Pat. No. 11,468,810.

(30) Foreign Application Priority Data

Jul. 27, 2018 (CN) .......................... 201810852379.7

(51) Int. Cl.
*G09G 3/3266* (2016.01)
*G09G 3/20* (2006.01)
*G11C 19/28* (2006.01)

(52) U.S. Cl.
CPC ............. *G09G 3/20* (2013.01); *G11C 19/287* (2013.01); *G09G 2310/0286* (2013.01);
(Continued)

(58) Field of Classification Search
CPC ............... G11C 19/287; G09G 3/3266; G09G 2330/028; G09G 2310/061; G09G 2310/08; G09G 2310/0286
See application file for complete search history.

(56) References Cited

U.S. PATENT DOCUMENTS

2010/0007635 A1 1/2010 Kwon et al.
2015/0206490 A1 7/2015 Lim et al.
(Continued)

FOREIGN PATENT DOCUMENTS

CN 101625838 A 1/2010
CN 103943083 A 7/2014
(Continued)

OTHER PUBLICATIONS

International Search Report & Written Opinion dated Sep. 26, 2019, regarding PCT/CN2019/093721.
(Continued)

*Primary Examiner* — Dennis P Joseph
(74) *Attorney, Agent, or Firm* — Intellectual Valley Law, P.C.

(57) ABSTRACT

The present application discloses a shift-register unit circuit including a first input sub-circuit configured to receive a display-input signal from a display-input terminal and input a display output-control signal to a first node based on the display-input signal during a display period of one cycle of displaying one frame of image. The shift-register unit circuit also includes a second input sub-circuit configured to receive a blank-input signal for charging a blank-control node, and configured to input a blank-output-control signal
(Continued)

to the first node based on the blank-input signal during a blank period of the one cycle. The shift-register unit circuit further includes an output sub-circuit configured to output a hybrid signal controlled by the first node. The second input sub-circuit is also configured, before an end of the blank period, to receive a first blank-reset signal to reset the blank-control node.

20 Claims, 20 Drawing Sheets

(52) U.S. Cl.
CPC ... *G09G 2310/061* (2013.01); *G09G 2310/08* (2013.01); *G09G 2330/028* (2013.01)

(56) References Cited

U.S. PATENT DOCUMENTS

| | | | |
|---|---|---|---|
| 2016/0358666 A1* | 12/2016 | Pang | G09G 3/3688 |
| 2017/0010731 A1 | 1/2017 | Zhang et al. | |
| 2018/0096644 A1 | 4/2018 | Jang et al. | |
| 2018/0337692 A1 | 11/2018 | Murakami | |
| 2021/0142713 A1 | 5/2021 | Feng et al. | |

FOREIGN PATENT DOCUMENTS

| | | |
|---|---|---|
| CN | 104795030 A | 7/2015 |
| CN | 105741742 A | 7/2016 |
| CN | 106486049 A | 3/2017 |
| CN | 106548747 A | 3/2017 |
| CN | 107886886 A | 4/2018 |
| CN | 109935269 A | 6/2019 |
| EP | 3754645 A1 | 12/2020 |
| KR | 20170078978 A | 7/2017 |

OTHER PUBLICATIONS

First Office Action in the Chinese Patent Application No. 201810852379. 7, dated Sep. 3, 2021; English translation attached.
Extended European Search Report in the European Patent Application No. 19839244.1, dated Apr. 11, 2022.
Non-Final Office Action in the U.S. Appl. No. 16/612,947, dated Jan. 24, 2022.
Response to Non-Final Office Action in the U.S. Appl. No. 16/612,947, dated Apr. 22, 2022.
Restriction Requirement in the U.S. Appl. No. 16/612,947, dated Nov. 1, 2021.
Response to Restriction Requirement in the U.S. Appl. No. 16/612,947, dated Dec. 14, 2021.
Notice of Allowance in the U.S. Appl. No. 16/612,947, dated Jun. 2, 2022.

\* cited by examiner

SHIFT-REGISTER UNIT CIRCUIT, GATE-DRIVING CIRCUIT, DISPLAY APPARATUS, AND DRIVING METHOD

CROSS-REFERENCE TO RELATED APPLICATION

This application is a divisional of U.S. application Ser. No. 16/612,947, filed Jun. 28, 2019, which is a national stage application under 35 U.S.C. § 371 of International Application No. PCT/CN2019/093721, filed Jun. 28, 2019, which claims priority to Chinese Patent Application No. 201810852379.7, filed Jul. 27, 2018. Each of the forgoing applications is herein incorporated by reference in its entirety for all purposes.

TECHNICAL FIELD

The present invention relates to display technology, more particularly, to a shift-register unit, a gate-driving circuit containing the shift-register unit, and a driving method thereof.

BACKGROUND

In a display panel, especially for an OLED display, the driving circuit is typically integrated in a Gate Integrated Circuit (Gate IC). When designing a chip of the Gate IC, the cost of the chip is mainly depended on the area of the chip. Existing OLED gate-driving circuit includes three sub-circuits, i.e., a sense unit circuit, a scan unit circuit, and a gate circuit or a Hiz circuit for outputting signals from the sense unit circuit and the scan unit circuit, making a complex circuit structure and hard to meet more and more stringent requirement on high resolution and narrow frame boarder for the OLED display panel. Also, long-time stresses on the transistors induced by pre-charging several nodes in a shift-register circuit, which is served as a unit circuit for forming the gate-driving circuit, to store voltages for subsequent output control cause many problems in performance and liability of the Gate IC. Therefore, an improved shift-register circuit design with reduced stress-time of transistors and an innovated circuit driving method are desired.

SUMMARY

In one aspect, the present disclosure provides a shift-register unit circuit comprising a first input sub-circuit configured to have a display-input terminal to receive a display-input signal, and to provide a display output-control signal to a first node based on the display-input signal; a second input sub-circuit configured to have a blank-input terminal to receive a blank-input signal for charging a blank-control node, and to provide a blank output-control signal to the first node based on the blank-input signal; an output sub-circuit configured to have an output terminal to output a hybrid output signal under control of the first node, the hybrid output signal being a display-output signal under control of the display output-control signal and a blank-output signal under control of the blank output-control signal; a first control sub-circuit, configured to control a voltage level a second node under control of the first node; and a second control sub-circuit configured to pull down voltage levels of the first node and the output terminal to turn-off voltage levels under control of the second node; wherein the second input sub-circuit is configured to provide the blank output-control signal to the first node based on a blank-control signal; the first control sub-circuit comprises a first control transistor and a second control transistor, the first control transistor having a first terminal and a control terminal commonly connected to a first pull-down control-signal line, and a second terminal connected to the second node; the second control transistor having a first terminal connected to the second node, a control terminal connected to the first node, and a second terminal connected to a first signal line providing a turn-off voltage level; and the second control sub-circuit comprises a first pull-down transistor and a second pull-down transistor, the first pull-down transistor having a first terminal connected to the first node, a control terminal connected to the second node, and a second terminal connected to the first signal line providing the turn-off voltage level; the second pull-down transistor having a first terminal connected to the output terminal, a control terminal connected to the second node, and a second terminal connected to the first signal line providing the turn-off voltage level.

Optionally, the second input sub-circuit comprises an isolation sub-circuit, wherein the isolation sub-circuit is set between the first node and the blank-control node, and is configured to prevent mutual interference between the first node and the blank-control node.

Optionally, the shift-register unit circuit further comprises an anti-leak sub-circuit configured to provide a working voltage level to an anti-leak connection point.

Optionally, the second input sub-circuit comprises a charging sub-circuit, configured to charge the blank-control node based on the blank-input signal; and a storage sub-circuit, configured to have one terminal connected to the blank-control node, and configured to store the blank-control signal based on the blank-input signal.

Optionally, the charging sub-circuit comprises a charging transistor having a first terminal connected to the blank-input terminal, and a second terminal connected to the blank-control node; the storage sub-circuit comprises a first capacitor having a first terminal connected to the blank-control node; the second input sub-circuit comprises an isolation sub-circuit; and the isolation sub-circuit comprises a first isolation transistor and a second isolation transistor; the first isolation transistor having a first terminal configured to provide a high level voltage to an N point in a blank period of the one cycle of displaying one frame of image, a control terminal connected to the blank-control node; the second isolation transistor having a first terminal connected to a second terminal of the first isolation transistor, a second terminal connected to the first node, and a control terminal connected to a third clock-signal line, the N point between the first isolation transistor and the second isolation transistor.

Optionally, the isolation sub-circuit further comprises a third isolation transistor coupled with the second isolation transistor in series, the third isolation transistor having a control terminal connected to a first clock-signal line or the third clock-signal line.

Optionally, the anti-leak sub-circuit comprises a first anti-leak transistor having a control terminal connected to the first node, a first terminal connected to a first signal line providing a turn-on voltage level, and a second terminal connected to an anti-leak node, and being configured to provide the turn-on voltage level from the first signal line to the anti-leak node under control of the first node; a second anti-leak transistor having a control terminal connected to a first clock-signal line or a third clock-signal line, a first terminal connected to the first node, and a second terminal connected to the anti-leak node which is further connected to the second terminal of a second isolation transistor.

Optionally, the anti-leak sub-circuit is configured to provide the working voltage level to the second terminal of the second isolation transistor under control of the first node.

Optionally, the anti-leak sub-circuit comprises a third anti-leak transistor and a fourth anti-leak transistor; the third anti-leak transistor has a control terminal connected to the first node, a first terminal connected to a high-voltage signal line, and a second terminal connected to a first terminal of the fourth anti-leak transistor; and the fourth anti-leak transistor has a second terminal connected to the anti-leak connection point.

Optionally, the shift-register unit circuit further comprises a display-input sub-circuit; wherein the display-input sub-circuit is configured to, under control of a cascade signal or a display input signal, provide a display output-control signal; and the display-input sub-circuit comprises a first display-input transistor having a control terminal configured to receive the cascade signal or the display input signal, a first terminal connected to a high-voltage signal line or the cascade signal, and a second terminal connected to the first node.

Optionally, the display-input sub-circuit is configured to, under control of the cascade signal or the display input signal, receive a high-voltage signal from the high-voltage signal line; and the display-input sub-circuit further comprises a second display-input transistor having a control terminal configured to receive the cascade signal or the display input signal, a first terminal connected to the high-voltage signal line or the display input signal, and a second terminal connected to an anti-leak connection point.

Optionally, the display-input sub-circuit is configured to, under control of the cascade signal or the display input signal, receive cascade signal; the display-input sub-circuit further comprises a second display-input transistor having a control terminal configured to receive the cascade signal or the display input signal, a first terminal configured to receive the cascade signal, and a second terminal connected to an anti-leak connection point.

Optionally, the first input sub-circuit further comprises a first display input transistor having a control terminal configured to receive a cascade signal or a display input signal, a first terminal connected to a high-voltage signal line, and a second terminal connected to the first node; and a second display input transistor having a control terminal and a first terminal connected to the high-voltage signal line, and a second terminal coupled to the first node.

Optionally, the shift-register unit circuit further comprises a display-reset sub-circuit configured to reset the first node under control of a display-reset signal provided from a reset-signal line after outputting the display-output signal in a display period of one cycle of displaying one frame of image.

Optionally, the display-reset sub-circuit comprises a display-reset transistor having a first terminal connected to a first node, a control terminal connected to a display-reset terminal, and a second terminal connected to the first signal line.

Optionally, the anti-leak sub-circuit comprises a fifth anti-leak transistor, a sixth anti-leak transistor, a seventh anti-leak transistor, and an eighth anti-leak transistor; and one terminal of each of the fifth anti-leak transistor, the sixth anti-leak transistor, the seventh anti-leak transistor, and the eighth anti-leak transistor is connected to the anti-leak connection point.

Optionally, the output sub-circuit comprises a first output transistor, a second output transistor, and a third output transistor; the first output transistor has a first terminal connected to a fourth clock-signal line, a second terminal connected to a first output terminal, and a control terminal connected to the first node; the second output transistor has a first terminal connected to a fifth clock-signal line, a second terminal connected to a second output terminal, and a control terminal connected to the first node; the third output transistor has a first terminal connected to a sixth clock-signal line, a second terminal connected to a third output terminal, and a control terminal connected to the first node; and the sixth clock-signal line is a clock signal line different from or same as the fifth clock-signal line.

In another aspect, the present disclosure provides a gate-driving circuit comprising N stages of shift-register unit circuits cascaded in series, a respective one of the shift-register unit circuits being same as the shift-register unit circuit described herein; wherein a display-input terminal of an i-th stage of shift-register unit circuit is connected to an output terminal of an (i−1)-th stage of shift-register unit circuit, wherein N is an integer greater than 2 and $1<i\leq N$; a display-input terminal of a first stage of shift-register unit circuit is connected to a display-signal line; and a blank-input terminal of the first stage of shift-register unit circuit is connected to a blank-signal line.

In another aspect, the present disclosure provides a display apparatus comprising the gate-driving circuit described herein and a display panel connected to the gate-driving circuit.

In another aspect, the present disclosure provides a method of driving the shift-register unit circuit, comprising in a display period of one cycle of displaying one frame of image, providing a display output-control signal to a first node in the shift-register unit circuit via a first input sub-circuit thereof in a first control period; outputting a display-output signal via an output sub-circuit thereof under control of the display output-control signal at the first node in a first output period; in a blank period of the one cycle of displaying one frame of image, providing a blank output-control signal via a second input sub-circuit to the first node via a second input sub-circuit of shift-register unit circuit in a second control period; and outputting a blank-output signal via the output sub-circuit under control of the first node in a second output period.

In an aspect, the present disclosure provides a shift-register unit circuit. The shift-register unit circuit includes a first input sub-circuit configured to have a display-input terminal to receive a display-input signal, and to provide a display output-control signal to a first node based on the display-input signal during a display period of one cycle of displaying one frame of image. The shift-register unit circuit further includes a second input sub-circuit configured to have a blank-input terminal to receive a blank-input signal for charging a blank-control node, and to provide a blank output-control signal to the first node based on the blank-input signal during a blank period of the one cycle. Additionally, the shift-register unit circuit includes an output sub-circuit configured to have an output terminal to output a hybrid output signal under control of the first node. The hybrid output signal is a display-output signal under control of the display output-control signal during the display period and a blank-output signal under control of the blank output-control signal during the blank period of the one cycle. The second input sub-circuit is further configured to receive a first blank-reset signal to reset the blank-control node before an end of the blank period of the one cycle. The second input sub-circuit includes an isolation sub-circuit configured to provide the blank output-control signal to the first node based on a blank-control signal.

Optionally, the isolation sub-circuit is set between the first node and the blank-control node, and is configured to prevent mutual interference between the first node and the blank-control node.

Optionally, the shift-register unit circuit further includes an anti-leak sub-circuit configured to provide a working voltage level to the isolation sub-circuit for maintaining isolation between the first node and the blank-control node.

Optionally, the second input sub-circuit includes a charging sub-circuit configured to charge the blank-control node based on the blank-input signal and to reset the blank-control node based on the first blank-reset signal provided from a second clock-signal line before an end of the blank period of the one cycle. Further, the second input sub-circuit includes a storage sub-circuit configured to have one terminal connected to the blank-control node and configured to store the blank-control signal based on the blank-input signal.

Optionally, the charging sub-circuit includes a charging transistor having a first terminal connected to the blank-input terminal, a control terminal connected to a second clock-signal line, and a second terminal connected to the blank-control node. The storage sub-circuit includes a first capacitor having a first terminal connected to the blank-control node. The isolation sub-circuit includes a first isolation transistor and a second isolation transistor. The first isolation transistor has a first terminal connected to a third clock-signal line, a control terminal connected to the blank-control node. The second isolation transistor has a first terminal connected to a second terminal of the first isolation transistor, a second terminal connected to the first node, and a control terminal connected to the third clock-signal line.

Optionally, the isolation sub-circuit further includes a third isolation transistor coupled with the second isolation transistor in series. The third isolation transistor has a control terminal connected to a first clock-signal line. The first clock-signal line provides a voltage level lower than that provided to the third clock-signal line.

Optionally, the anti-leak sub-circuit includes a first anti-leak transistor having a control terminal connected to the first node, a first terminal connected to a first signal line providing a turn-off voltage level, and a second terminal connected to an anti-leak node. The first anti-leak transistor is configured to provide the turn-off voltage level from the first signal line to the anti-leak node under control of the first node. The anti-leak sub-circuit also includes a second anti-leak transistor having a control terminal connected to a first clock-signal line or the third clock-signal line, a first terminal connected to the first node, and a second terminal connected to the anti-leak node which is further connected to the second terminal of the second isolation transistor.

Optionally, the anti-leak sub-circuit is configured to provide the working voltage level to the second terminal of the second isolation transistor under control of the first node.

Optionally, the shift-register unit circuit further includes a display-reset sub-circuit configured to reset the first node under control of a display-reset signal provided from a reset-signal line after outputting the display-output signal in the display period.

Optionally, the display-reset sub-circuit includes a display-reset transistor having a first terminal connected to a first node, a control terminal connected to a display-reset terminal providing the display-reset signal, and a second terminal connected to a first signal line providing a turn-off voltage level.

Optionally, the shift-register unit circuit further includes a blank-reset sub-circuit configured to reset the first node under control of a second blank-reset signal before an end of the blank period of the one cycle. The second blank-reset signal is provided from a blank-reset-signal line.

Optionally, the blank-reset sub-circuit includes a blank-reset transistor having a first terminal connected to the first node, a control terminal connected to the blank-reset-signal line, and a second terminal connected to a first signal line providing a turn-off voltage level.

Optionally, the output sub-circuit includes at least one shift-signal-output terminal and at least one pixel-signal-output terminal.

Optionally, the shift-register unit circuit further includes a first control sub-circuit configured to control a voltage level a second node under control of the first node and a second control sub-circuit configured to pull down voltage levels of the first node and the output terminal to turn-off voltage levels under control of the second node.

Optionally, the first control sub-circuit includes a first control transistor and a second control transistor. The first control transistor has a first terminal and a control terminal commonly connected to a first pull-down control-signal line, and a second terminal connected to the second node. The second control transistor has a first terminal connected to the second node, a control terminal connected to the first node, and a second terminal connected to a first signal line providing a turn-off voltage level. The second control sub-circuit includes a first pull-down transistor and a second pull-down transistor. The first pull-down transistor has a first terminal connected to the first node, a control terminal connected to the second node, and a second terminal connected to the first signal line providing the turn-off voltage level. The second pull-down transistor has a first terminal connected to the output terminal, a control terminal connected to the second node, and a second terminal connected to the first signal line providing the turn-off voltage level.

Optionally, the charging sub-circuit includes a charging transistor having a first terminal connected to a high voltage signal line VDD, a control terminal connected to the blank-input terminal, and a second terminal connected to the blank-control node. The storage sub-circuit includes a first capacitor having a first terminal connected to the blank-control node. The isolation sub-circuit includes a first isolation transistor and a second isolation transistor; the first isolation transistor having a first terminal connected to the high voltage signal line VDD, a control terminal connected to the blank-control node; the second isolation transistor having a first terminal connected to a second terminal of the first isolation transistor, a second terminal connected to the first node, and a control terminal connected to a first clock-signal line.

Optionally, the first input sub-circuit includes a first display-input transistor having a first terminal connected to the first node, a second terminal and/or a control terminal connected to the display-input terminal. The output sub-circuit includes an output transistor and an output capacitor. The output transistor has a first terminal connected to a fourth clock-signal line providing a driving signal, a second terminal connected to the output terminal, and a control terminal connected to the first node. The output capacitor has a first terminal connected to the first node and a second terminal connected to the output terminal.

In another aspect, the present disclosure provides a gate-driving circuit including N stages of shift-register unit circuits cascaded in series. A respective one of the shift-register unit circuits is one described herein. In the N stages of shift-register unit circuits, an i-th stage of shift-register unit circuit includes a display-input terminal connected to an output terminal of an (i−1)-th stage of shift-register unit circuit and an output terminal connected to a display-reset terminal of the (i−1)-th stage of shift-register unit circuit. N is an integer greater than 2 and i is a positive integer no greater than N. Additionally, a first stage of shift-register unit circuit includes a display-input terminal connected to a display-signal line and a blank-input terminal connected to a blank-signal line. An N-th stage of shift-register unit circuit includes a display-reset terminal coupled to a reset-signal line.

In yet another aspect of the present disclosure, a display apparatus is provided with a gate-driving circuit described herein including N numbers of gate lines in which an i-th gate line is connected to the output terminal of the i-th stage of shift-register unit circuit to receive an i-th display-output signal, N is an integer greater than 2 and i is a positive integer no greater than N.

In still another aspect, the present disclosure provides a method of driving the shift-register unit circuit described herein. The method includes, in a display period of one cycle of displaying one frame of image, providing a display output-control signal to a first node in the shift-register unit circuit via a first input sub-circuit thereof in a first control period. The method also includes a step of outputting a display-output signal via an output sub-circuit thereof under control of the display output-control signal at the first node in a first output period. Additionally, the method includes, in a blank period of the one cycle of displaying one frame of image, providing a blank output-control signal via an isolation sub-circuit based on a blank-control signal to the first node via a second input sub-circuit of shift-register unit circuit in a first control period. The method further includes a step of providing a working voltage level to the isolation sub-circuit to maintain isolation between the first node and the blank-control node. Furthermore, the method includes a step of outputting a blank-output signal via the output sub-circuit under control of the blank output-control signal at the first node in a second output period. Moreover, the method includes a step of resetting a blank-control node in the shift-register unit circuit under control of a first blank-reset signal in a first blank-reset period.

Optionally, the method includes a step of resetting the first node under control of a display-reset signal from a display-reset terminal in the shift-register unit circuit during a display-reset period after the first output period.

Optionally, the method includes a step of resetting the first node under control of a second blank-reset signal during a second blank-reset period after the blank period.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
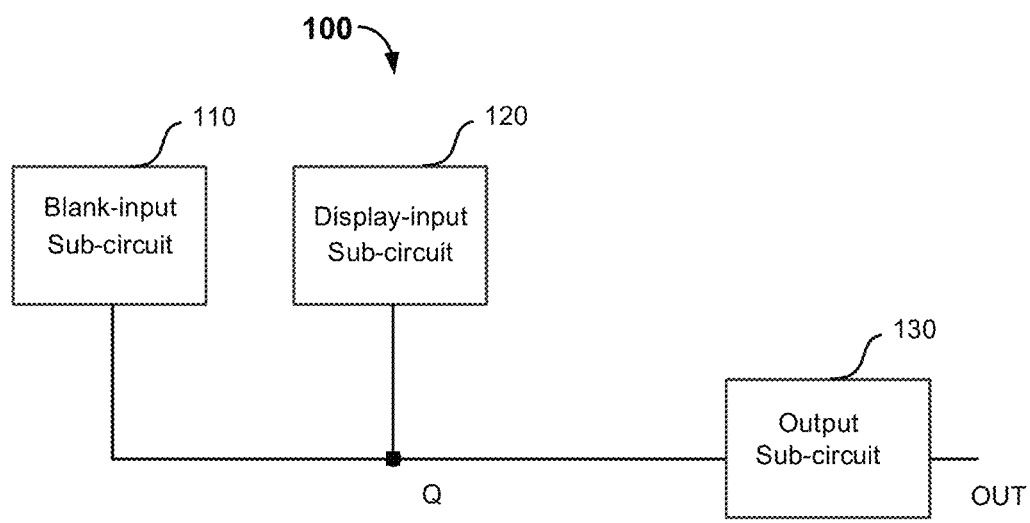
FIG. 1 is a block diagram of a shift-register unit circuit according to some embodiments of the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In the following detailed description, numerous specific details are set forth in order to provide a more thorough understanding of the present disclosure. However, it will be apparent to one skilled in the art that the present disclosure may be practiced without necessarily being limited to these specific details. In other instances, well-known structures devices, and circuits are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, the words "first," "second," and similar terms used in the present disclosure do not denote any order, quantity, or importance, but are used to distinguish different components. Similarly, the words "comprising" or "comprising" or "comprising" or "an" or "an" The words "connected" or "connected" and the like are not limited to physical or mechanical connections, but may include electrical connections, whether direct or indirect. "Upper", "lower", "left", "right", etc. are only used to indicate the relative positional relationship, and when the absolute position of the object to be described is changed, the relative positional relationship may also change accordingly.

The words "a", "an", "the" and "the" In general, the terms "comprising" and "comprising" are intended to include only the steps and elements that are specifically identified, and the steps and elements do not constitute an exclusive list, and the method or device may also include other steps or elements.

The transistors employed in all embodiments of the present disclosure may each be a thin film transistor or a field effect transistor or other device having the same characteristics. In this embodiment, the connection modes of the drain and the source of each transistor are interchangeable. Therefore, the drain and source of each transistor in the embodiment of the present disclosure are practically indistinguishable. Here, only to distinguish the two poles of the transistor except the gate, one of which is called the drain and the other is called the source. The thin film transistor used in the embodiment of the present disclosure may be an N-type transistor or a P-type transistor. In an embodiment of the present disclosure, when an N-type thin film transistor is employed, its first electrode may be a source and the second electrode may be a drain. In the following embodiments, an example in which a thin film transistor is an N-type transistor is used, that is, when the signal of the gate is at a high level, the thin film transistor is turned on. When a P-type transistor is used, the timing of the drive signal needs to be adjusted accordingly. The details are not described herein, but should also be within the scope of the present invention. For example, when described in the present disclosure as an N-type transistor, since the on-level is a high level, the signal when the control transistor is turned on in the present disclosure is sometimes referred to as a "pull-up signal" at a "turn-on voltage level", and the control transistor is turned off. The signal is sometimes referred to as a "pull down signal" at a "turn-off voltage level." It will be understood by those skilled in the art that if the N-type transistor in the present disclosure is replaced with a P-type transistor, the "pull-up signal" in the present disclosure can be replaced with a "pull-down signal", and the "pull-down signal" in the present disclosure. Replace with "pull-up signal".

Accordingly, the present disclosure provides, inter alia, a shift-register unit circuit, a gate-driving circuit cascaded by multi-stages of shift-register unit circuits, a display panel and a display apparatus having the same, that substantially obviate one or more of the problems due to limitations and disadvantages of the related art. In one aspect, the present disclosure provides a shift-register unit circuit. FIG. 1 is a block diagram of a shift-register unit circuit according to some embodiments of the present disclosure. Referring to FIG. 1, the shift-register unit circuit 100 includes a first input sub-circuit 120, a second input sub-circuit 110, and an output sub-circuit 130, coupled to each other via a first node Q. The second input sub-circuit 110 is also named as blank-input sub-circuit. The first input sub-circuit 120 is also named as display-input sub-circuit. The blank-input sub-circuit 110 is configured to have a blank-input terminal to receive a blank-input signal for charging a blank-control node H (to be shown below), and to provide a blank output-control signal to the first node Q based on the blank-input signal during a blank period of the one cycle. The "blank" here just means the sub-circuit is related to the blank period within one cycle of displaying one frame of image and does not limit the sub-circuit to work only in the blank period. For example, the blank-input sub-circuit 20 is also configured to be operated during the display period in a cycle of displaying one frame of image to charge the blank-control node H to keep it at a high voltage level until the blank period starts after the display period ends.

In some embodiments, depending on transistor types used, the first node Q in the shift-register unit circuit is configured to be a pull-up node, i.e., a voltage level at the first node Q is pulled up to a working (high) voltage level. In other embodiments, the first node Q may be configured to be a pull-down node, i.e., the voltage level at the first node Q is pulled down to a working (low) voltage level.

In some embodiments, the blank-input sub-circuit 110 is configured to receive and store the blank-input signal, and to provide a blank-pull-up signal, under control of the blank-input signal, to the first node Q so that a voltage level at the first node Q is raised to a working level. For example, the blank-input sub-circuit 110 is operated in a blank period of one cycle to receive the blank-input signal and store a blank-control signal, and to provide a blank-pull-up signal to the first node Q in the current cycle under control of the blank-control signal. In another example, the blank-input sub-circuit 110 is operated in a blank period of one cycle to receive the blank-input signal and store a blank-control signal, and to provide a blank-pull-up signal to the first node Q in a next cycle under control of the blank-control signal.

Referring to FIG. 1, the display-input sub-circuit 120 is configured to have a display-input terminal to receive a display-input signal, and to provide a display output-control signal to the first node Q to pull up a voltage level thereof to a working level.

The output sub-circuit 130 is configured, under control of the first node Q, to output a hybrid output signal via an output terminal OUT. The hybrid output signal is either a display-output signal or a blank-output signal. The display-output signal and the blank-output signal can be two independent pulses with different pulse-width and timing.

In some embodiments, the output sub-circuit 230 is configured within a display period of one cycle of displaying one frame of image to output a display-output signal via an output terminal under control of the first node Q. In the blank period of the cycle, the output sub-circuit 230 is configured to output a blank-output signal via the output terminal under control of the first node Q.

In some embodiments, the shift-register unit circuit 100 of the present disclosure is configured to perform a reset operation to the blank-input sub-circuit 110 before an end of the blank period in the cycle. It is intended to reduce time durations of the transistors of the shift-register unit circuit being at conduction states so that the problem of transistor performance degradation due to long-term stress is mitigated.

Figure 2A:
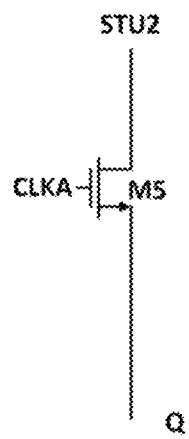
FIG. 2A is an exemplary circuit diagram of a display-input sub-circuit of the shift-register unit circuit according to a first embodiment of the present disclosure.

FIGS. 2A through 2E show some exemplary circuit diagrams of the display-input sub-circuit in FIG. 1 according to some embodiments of the present disclosure. As shown, the display-input sub-circuit 120 includes a display-input transistor M5. Referring to FIG. 2A, the display-input transistor M5 has a first terminal connected to a display-input terminal STU2. The display-input transistor M5 has a second terminal connected to the first node Q. The display-input transistor M5 has a control terminal connected to a first clock-signal line CLKA. In a display period of one cycle, under control of a first clock signal provided with the first clock-signal line CLKA, the display-input transistor M5 is turned on to input a display-input signal from the display-input terminal STU2 as a display-pull-up signal to the first node Q.

Figure 2B:
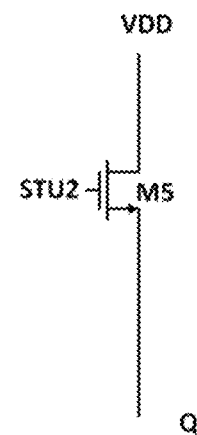
FIG. 2B is an exemplary circuit diagram of a display-input sub-circuit of the shift-register unit circuit according to a second embodiment of the present disclosure.
Figure 2C:
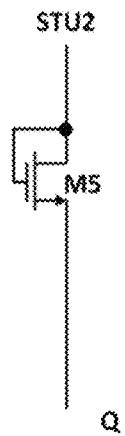
FIG. 2C is an exemplary circuit diagram of a display-input sub-circuit of the shift-register unit circuit according to a third embodiment of the present disclosure.
Figure 2D:
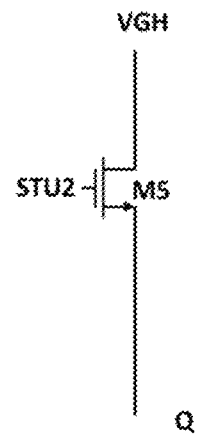
FIG. 2D is an exemplary circuit diagram of a display-input sub-circuit of the shift-register unit circuit according to a fourth embodiment of the present disclosure.

Referring to FIG. 2B and FIG. 2D, the display-input transistor M5 has a first terminal connected to a high-voltage-signal line VDD or VDH, which is provided a constant high voltage at a turn-on voltage level. The display-input transistor M5 has a second terminal connected to the first node Q and a control terminal connected to the display-input terminal STU2. Optionally, under control of a display-input signal from the display-input terminal STU2, the display-input transistor M5 is turned on to pass the high voltage signal from the high-voltage-signal line VDD or VDH to set the first node Q to the turn-on voltage level.

Referring to FIG. 2C, the display-input transistor M5 has a first terminal and a control terminal commonly connected to a display-input terminal STU2. The display-input transistor M5 also has a second terminal connected to the first node Q. Optionally, in the display period of a cycle, under control of a display-input signal from the display-input terminal STU2, the display-input transistor M5 is turned on and at the same time pass the display-input signal as a display pull-up signal to the first node Q.

Figure 2E:
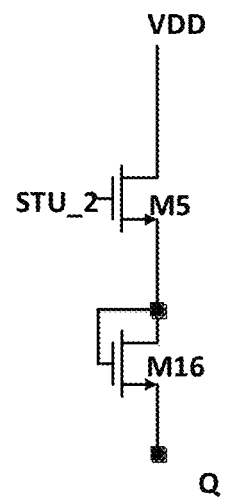
FIG. 2E is an exemplary circuit diagram of a display-input sub-circuit of the shift-register unit circuit according to a fifth embodiment of the present disclosure.

Optionally, the display-input sub-circuit 120 also includes a second display-input transistor M16 connected between the display-input transistor M5 and the first node Q. Referring to FIG. 2E, a first terminal and a control terminal of the second display-input transistor M16 are connected together with the second terminal of the display-input transistor M5. A second terminal of the second display-input transistor M16 is connected with the first node Q. When the display-input transistor M5 is turned on under control of the display-input terminal, the second display-input transistor M16 can prevent a glitch at the output terminal due to capacitive coupling in the circuit when a high-voltage signal being inputted to the first node Q.

Figure 2F:
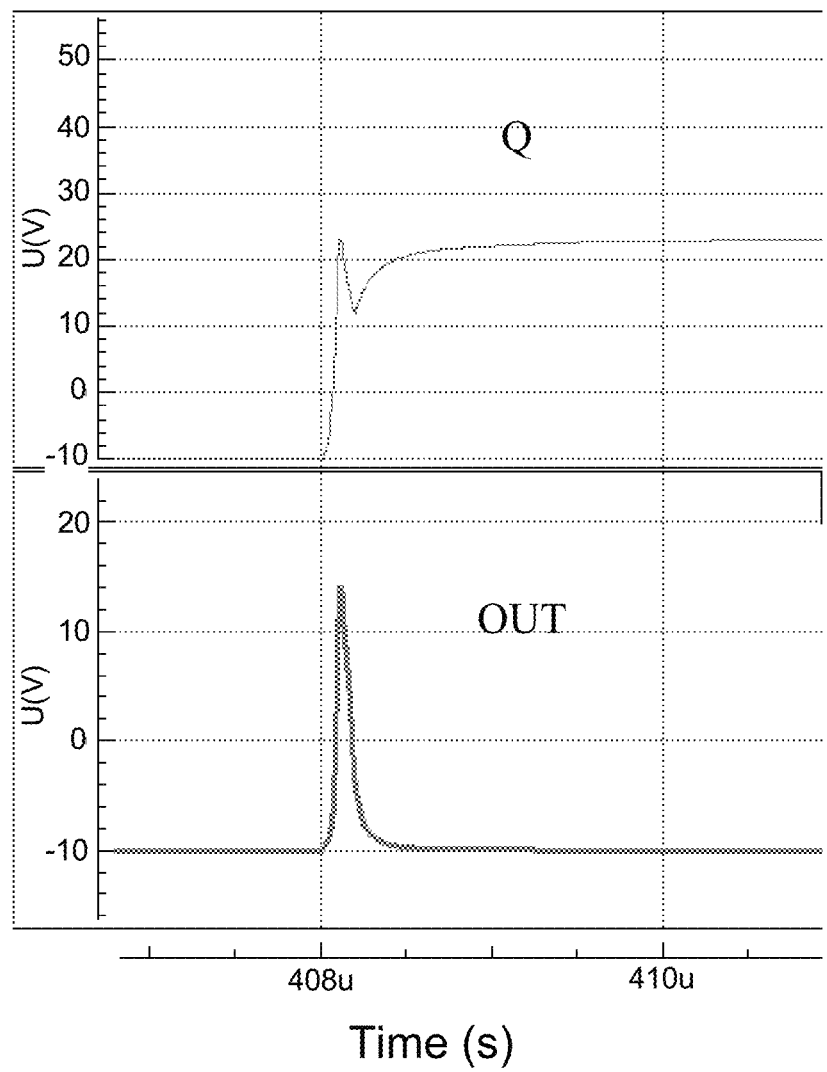
FIG. 2F is a simulation diagram of voltage levels at an output terminal and a first node in a conventional shift-register unit circuit.

Referring to FIG. 2F, it is a schematic simulation diagram showing a large glitch generated at an output terminal of a conventional shift-register unit circuit. Such glitches due to capacitive coupling in the circuit can be large to cause one stage shift-register unit circuit to output a wrong signal and cause it entering an abnormal working state.

Figure 2G:
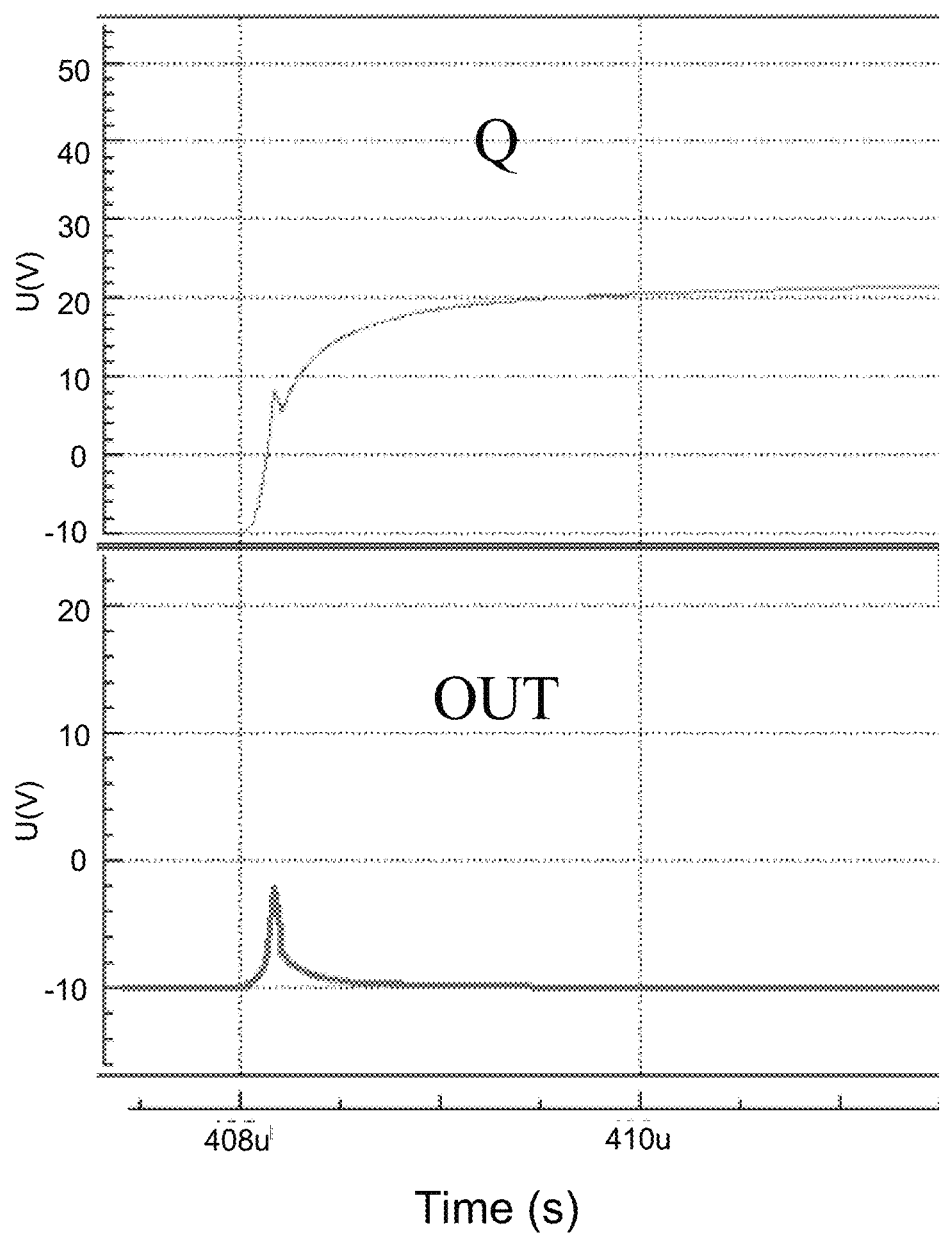
FIG. 2G is a simulation diagram of voltage levels at an output terminal and a first node in the shift-register unit circuit according to an embodiment of the present disclosure.

Referring to FIG. 2G, it is a schematic diagram showing a reduced glitch at an output terminal of a shift-register unit circuit according to an embodiment of the present disclosure. When the display-input sub-circuit 120 includes the second display-input transistor M16, the high-voltage signal from VDD is not directly pulling up the voltage level at the first node. Instead, it is pulled up through the second display-input transistor M16 connected in series with the first node Q. the glitch effect at the output terminal OUT is reduced.

Figure 3A:
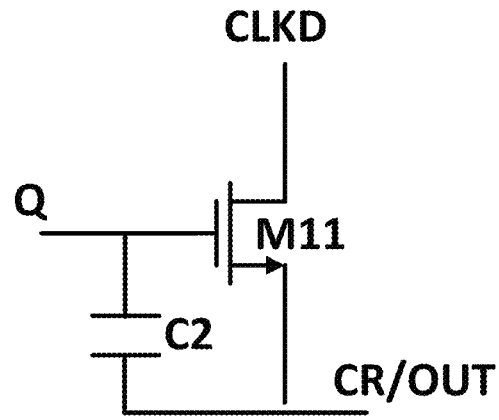
FIG. 3A is an exemplary circuit diagram of an output sub-circuit according to an embodiment of the present disclosure.
Figure 3B:
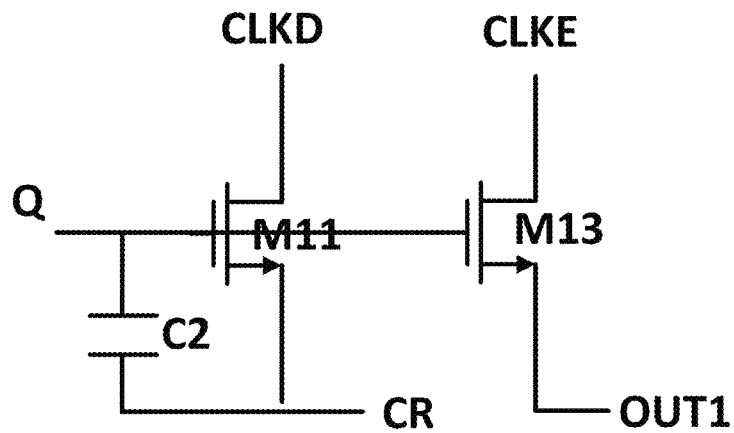
FIG. 3B is an exemplary circuit diagram of an output sub-circuit according to another embodiment of the present disclosure.
Figure 3C:
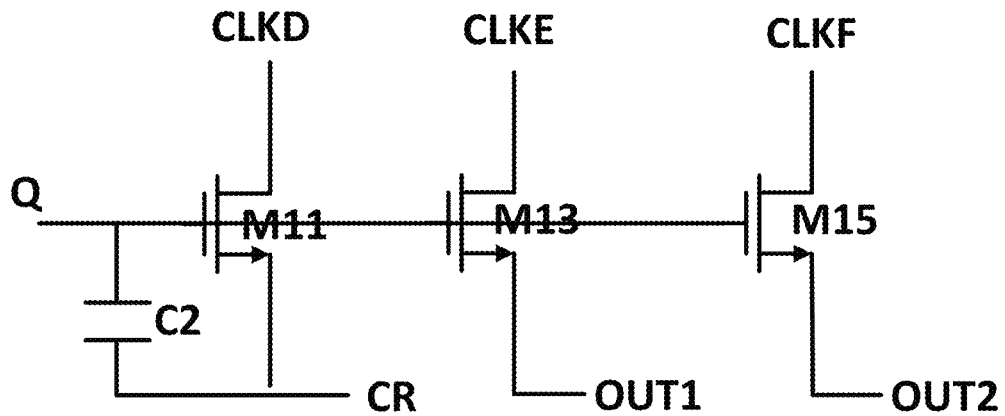
FIG. 3C is an exemplary circuit diagram of an output sub-circuit according to yet another embodiment of the present disclosure.

FIGS. 3A through 3C show exemplary circuit diagrams of an output sub-circuit of the shift-register unit circuit according to some embodiments of the present disclosure. Referring to FIG. 3A, the output sub-circuit 130 includes an output transistor M11 and an output capacitor C2. The output transistor M11 has a first terminal connected to a fourth clock-signal line CLKD, a second terminal connected to an output terminal CR/OUT, and a control terminal connected to the first node Q. The output capacitor C2 has a first terminal connected to the first node Q and a second terminal connected to the output terminal CR/OUT. The output capacitor C2 is configured to store and maintain the voltage level of the first node Q. When the voltage level of the first node Q is maintained at a high voltage level or turn-on voltage level, the output transistor M11 is turned on and output a signal from the fourth clock-signal line CLKD to the output terminal CR/OUT as an output signal. This output signal optionally is used as a driving signal for a pixel circuit, or optionally is used as a shift-register driving signal in a gate-driving circuit.

In some embodiments, for enhancing driving capability of the shift-register unit circuit 100, the output sub-circuit 130 additionally includes two output terminals. For example, referring to FIG. 3B, the output sub-circuit 130 includes a first output transistor M11 and a second output transistor M13. The first output transistor M11 has a first terminal connected to the fourth clock-signal line CLKD, a second terminal connected to a first output terminal CR, and a control terminal connected to the first node Q. The second output transistor M13 has a first terminal connected to a fifth clock-signal line CLKE, a second terminal connected to a second output terminal OUT1, and a control terminal connected to the first node Q. Here, an output signal outputted from the first output terminal CR can be used as a shift-register signal in a gate-driving circuit, while another output signal outputted from the second output terminal OUT1 can be used as a driving signal for driving a pixel circuit. Optionally, the fourth clock-signal line CLKD and the fifth clock-signal line CLKE can be two different clock-signal lines or can be a same clock-signal line.

In some other embodiments, the output sub-circuit 130 can includes multiple output terminals. For example, referring to FIG. 3C, the output sub-circuit 130 further includes a third output transistor M15 having a first terminal connected to a sixth clock-signal line CLKF, a second terminal connected to a third output terminal OUT2, and a control terminal connected to the first node Q. The sixth clock-signal line CLKF can be a same clock-signal line as the fourth clock-signal like CLKD or the fifth clock-signal line CLKF, or can be a different clock-signal line. It provides two different driving signals for a pixel circuit to enhance flexibility to drive the pixel circuit. For example, for a typical 3T1C-type pixel circuit, the two output signals can be respectively used as driving signals for a scan transistor and a sense transistor. Of course, there are more options or modifications or variations with the number of output terminals of the shift-register unit circuit which can be applied in different situations.

Figure 4:
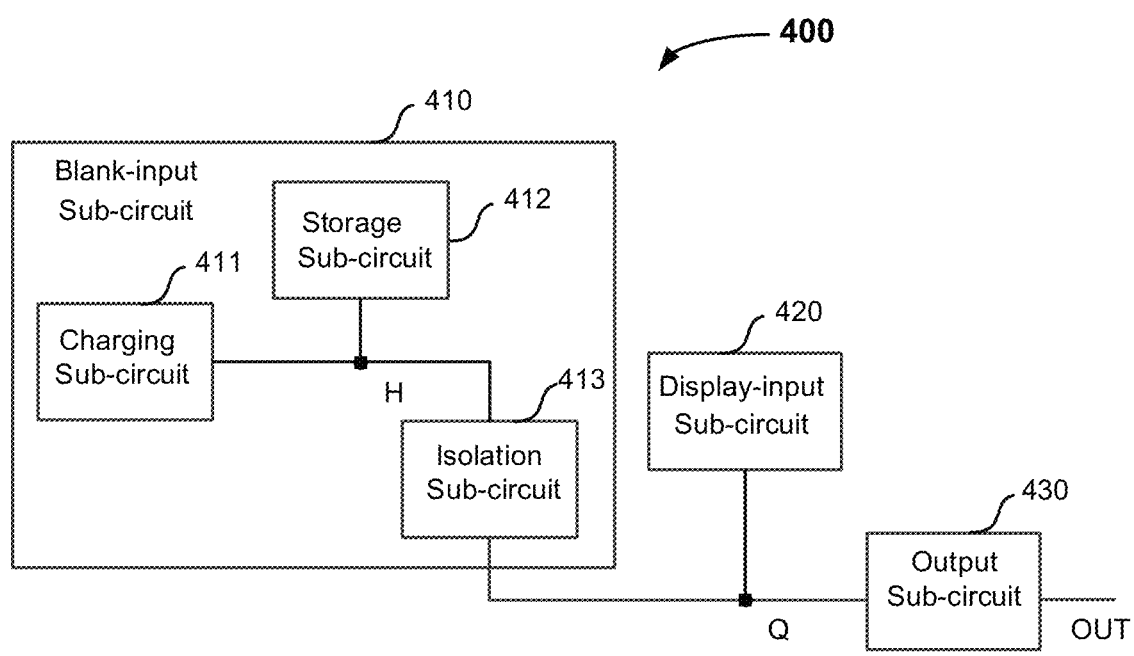
FIG. 4 is a block diagram of a shift-register unit circuit according to an embodiment of the present disclosure.

FIG. 4 shows a block diagram of a shift-register unit circuit according to another embodiment of the present disclosure. Referring to FIG. 4, the shift-register unit circuit 400 includes a blank-input sub-circuit 410, a display-input sub-circuit 420, and an output sub-circuit 430. The display-input sub-circuit 420 and the output sub-circuit 430 can be respective display-input sub-circuit 120 shown in FIG. 1, FIG. 2A through FIG. 2E and output sub-circuit 130 shown in FIG. 3A through FIG. 3C.

Referring to FIG. 4, the blank-input sub-circuit 410 includes a charging sub-circuit 411, a storage sub-circuit 412, and an isolation sub-circuit 413. The charging sub-circuit 411 is configured to charge a blank-control node H based on a blank-input signal. In some embodiments, the charging sub-circuit 411 receives the blank-input signal and provides a high-voltage blank-output-control signal or a blank-pull-up signal to the blank-control node H under control of the blank-input signal. Additionally, the charging sub-circuit 411 is also configured, before an end of a blank period in one cycle of displaying one frame of image, to receive a first blank-reset signal and to reset the blank-control node H under control of the first blank-reset signal.

In some embodiments, the charging sub-circuit 411 is further configured to charge the blank-control node H based on a random input signal. Optionally, the charging sub-circuit 411 receives a random input signal. Under control of the random input signal, a high-voltage blank-input signal can be inputted to the blank-control node H. For example, the random input signal can be a random voltage pulse generated by a control unit circuit (not shown) such as a field programmable gate array (FPGA) or a microprocessor. In other examples, the random input signal is an inputted voltage pulse in a random clock period during a display period in one cycle of displaying one frame of image.

The storage sub-circuit 412 has one terminal connected to the blank-control node H and another terminal configured to store a blank-control signal.

The isolation sub-circuit 413 is configured to input the blank-output-control signal at the blank-control node H to the first node Q based on the blank-control signal stored at the storage sub-circuit 412. In some embodiments, the isolation sub-circuit 413 is set between the first node Q and the blank-control node H and is used to prevent mutual interference between them. For example, when no need to output the blank-output-control signal, the isolation sub-circuit 413 can be cut off the connection between the first node Q and the blank-control node H.

FIG. 5A through FIG. 5H show various exemplary circuit diagrams of a blank-input sub-circuit of the shift-register unit circuit according to some embodiments of the present disclosure. Optionally, the charging sub-circuit 411 includes a charging transistor M1 configured to charge the blank-control node H based on a blank-input signal from a blank-input terminal. The charging transistor M1 has a first terminal and/or control terminal connected to the blank-input terminal and a second terminal connected to the blank-control node H.

Figure 5A:
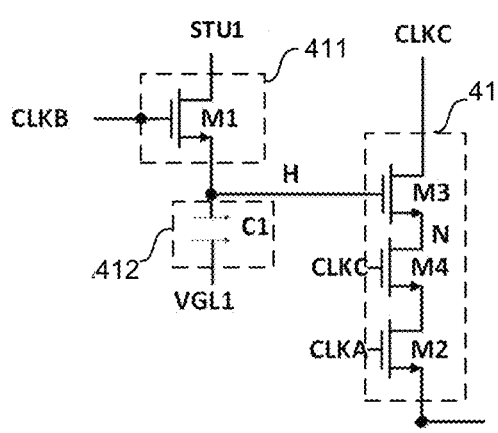
FIG. 5A is an exemplary circuit diagram of a blank-input sub-circuit of the shift-register unit circuit according to a first embodiment of the present disclosure.

In some embodiments, the charging sub-circuit 411 can be configured to input the blank-input signal to the blank-control node H. Referring to FIG. 5A or FIGS. 5C, 5D, and 5F, the charging transistor M1 has a first terminal connected to the blank-input terminal STU1, a second terminal connected to the blank-control node H, and a control terminal connected to a second clock-signal line CLKB. When a high-level turn-on voltage is supplied to the second clock-signal line CLKB, the charging transistor M1 is turned on and allow a blank-input signal from the blank-input terminal STU1 to be inputted to the blank-control node H. Referring to FIG. 5E, the charging transistor M1 has its control terminal connected to its first terminal and commonly connected to the blank-input terminal STU1 and its second terminal connected to the blank-control node H. When the blank-input terminal STU1 is supplied with a blank-input signal at a turn-on voltage level, the charging transistor M1 is turned on to allow the turn-on voltage level of the blank-input signal to be passed to the blank-control node H.

In some other embodiments, the charging sub-circuit can be configured, under control of the blank-input signal, to input a blank-output-control signal at a turn-on voltage level to the blank-control node H. For example, the charging transistor M1 has the first terminal connected to a high-voltage signal line VDD, the second terminal connected to the blank-control node H, and the control terminal connected to the blank-input terminal STU1. When the charging transistor M1 is turned on by a blank-input signal at the turn-on voltage level provided to the blank-input terminal STU1, a high-voltage signal from the VDD is passed as a blank-output-control signal to the blank-control node H.

In yet some other embodiments, the charging sub-circuit 411 is configured to charge the blank-control node H based on random input signal OE. For example, referring to FIG. 5G, the charging transistor M1 has a control terminal connected to a random-signal input terminal, a first terminal connected to an output terminal CR/OUT of a shift-register unit circuit, and a second terminal connected to the blank-control node H. Optionally, the charging transistor M1 can connect its control terminal to a random signal input terminal and connect its first terminal to an output terminal CR<N−1> of a previous stage shift-register unit circuit in a same gate-driving circuit. Optionally, the charging transistor M1 can connect its control terminal to an output terminal CR<N−1> of a previous stage shift-register unit circuit or an output terminal CR<N> of a current stage shift-register unit circuit, and connect its first terminal to a random signal input terminal.

The charging sub-circuit 411 may be configured to input a blank-input signal to the blank-control node H based on a random input signal. For example, a random signal input terminal in a shift-register unit circuit can randomly provide a high voltage signal during a display period in one cycle of displaying one frame of image. The charging transistor M1, under control of the random input signal at the high voltage level, is turned on. For a shift-register unit circuit that is outputting a high voltage level signal, the high voltage signal can be inputted through M1 to the blank-control node H, i.e., to charge the blank-control node H. For a shift-register unit circuit that is not outputting a high voltage level signal, it is not going to charge the blank-control node H. Through this circuitry structure, it is possible to randomly select one shift-register unit circuit among multiple cascaded shift-register unit circuits to compensate the charging of the blank-control node H based on the random pulse signal.

Additionally, the storage sub-circuit 412 includes a first capacitor C1 configured to store a blank-control signal. The first capacitor C1 has one terminal connected to the blank-control node H. Referring to FIG. 5A, the first capacitor C1 has a first terminal connected to the blank-control node H and a second terminal connected to a low voltage signal terminal VSS1 which inputs a turn-off voltage level signal. As shown earlier, when the charging sub-circuit inputs a blank-output-control signal at the turn-on voltage level to the blank-control node, it also charges the first capacitor and maintain the voltage level at the blank-control node H to the turn-on voltage level.

The first capacitor C1 has other ways of connection in the circuit. For example, referring to FIG. 5C, the first capacitor C1 has a first terminal connected to the blank-control node H and a second terminal connected to one terminal (e.g., a third clock-signal line CLKC) of the isolation sub-circuit 413. In another example, referring to FIG. 5D, the first capacitor C1 has a first terminal connected to the blank-control node H and a second terminal connected to one terminal (e.g., a joint N connected between a first isolation transistor M3 and a second isolation transistor M4) of the isolation sub-circuit 413.

The isolation sub-circuit 413 includes a first isolation transistor M3 and a second isolation transistor M4. In some embodiments, the isolation sub-circuit 413 is configured to output the blank-output-control signal to the first node Q under control of the blank-control node H. For example, referring to FIG. 5A (or FIG. 5C, FIG. 5D, FIG. 5E), the first isolation transistor M3 has a first terminal connected to the third clock-signal line CLKC, a second terminal connected to a first terminal of the second isolation transistor M4, and a control terminal connected to the blank-control node H. The second isolation transistor M4 has a second terminal connected to the first node Q and a control terminal connected to the third clock-signal line CLKC. When the blank-control node H is maintained at a turn-on voltage level controlled by the storage sub-circuit, the first isolation transistor M3 is turned on by the turn-on voltage at the blank-control node H. If the third clock-signal line CLKC supplies a turn-on voltage level signal, the second isolation transistor M4 is turned on to allow the turn-on voltage level from the third clock-signal line CLKC to pass as a blank-output-control signal (or a blank-pull-up signal) to the first node Q.

Figure 5B:
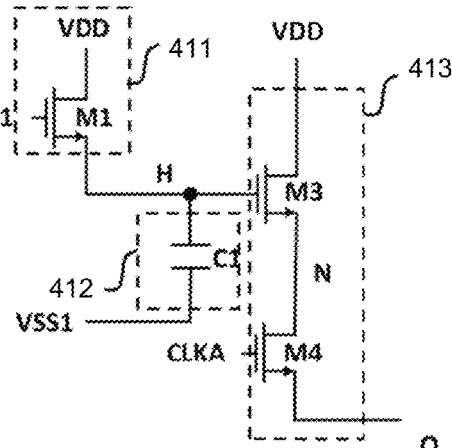
FIG. 5B is an exemplary circuit diagram of a blank-input sub-circuit of the shift-register unit circuit according to a second embodiment of the present disclosure.
Figure 5C:
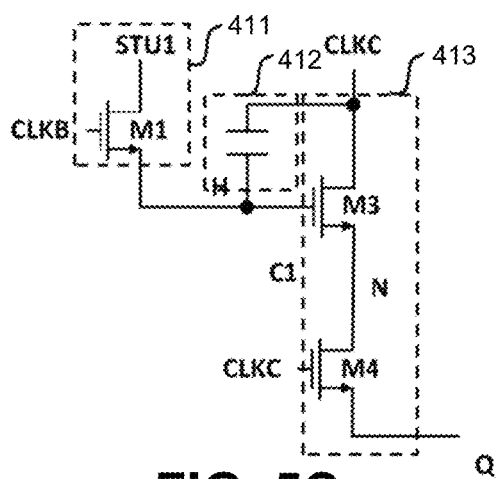
FIG. 5C is an exemplary circuit diagram of a blank-input sub-circuit of the shift-register unit circuit according to a third embodiment of the present disclosure.
Figure 5D:
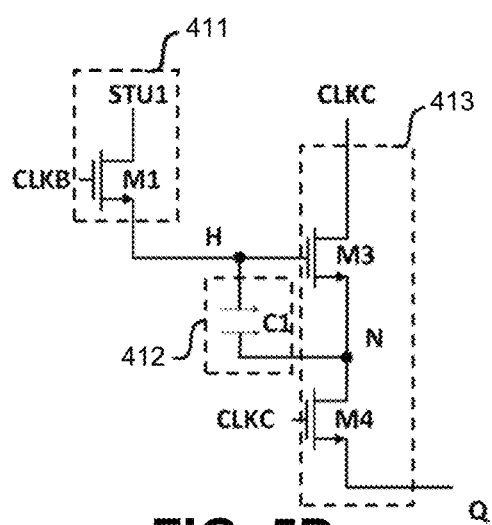
FIG. 5D is an exemplary circuit diagram of a blank-input sub-circuit of the shift-register unit circuit according to a fourth embodiment of the present disclosure.
Figure 5E:
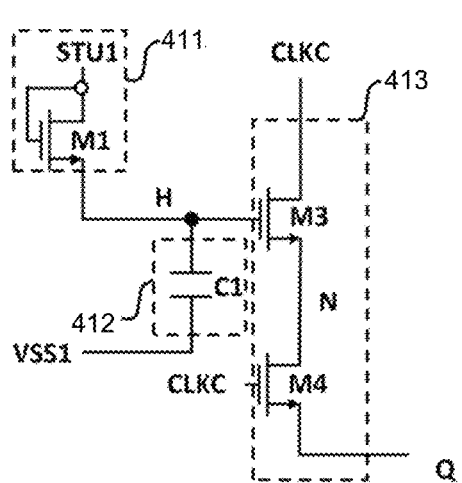
FIG. 5E is an exemplary circuit diagram of a blank-input sub-circuit of the shift-register unit circuit according to a fifth embodiment of the present disclosure.
Figure 5F:
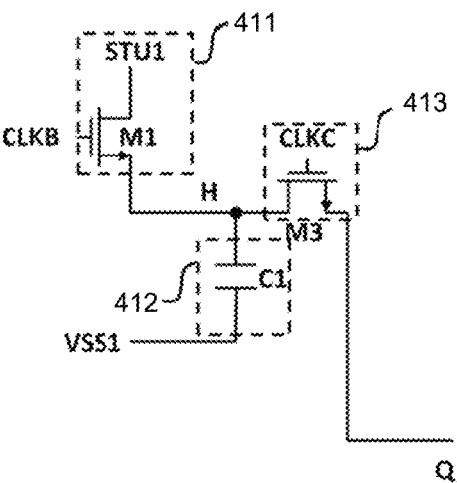
FIG. 5F is an exemplary circuit diagram of a blank-input sub-circuit of the shift-register unit circuit according to a sixth embodiment of the present disclosure.
Figure 5G:
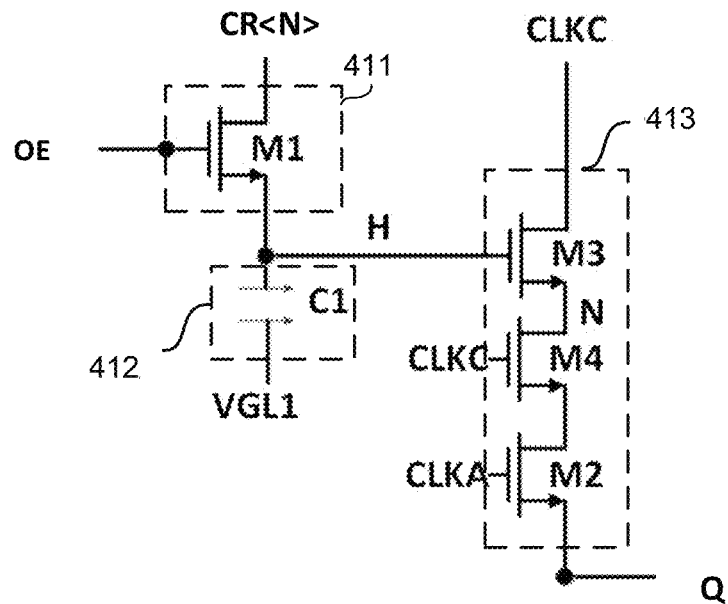
FIG. 5G is an exemplary circuit diagram of a blank-input sub-circuit of the shift-register unit circuit according to a seventh embodiment of the present disclosure.
Figure 5H:
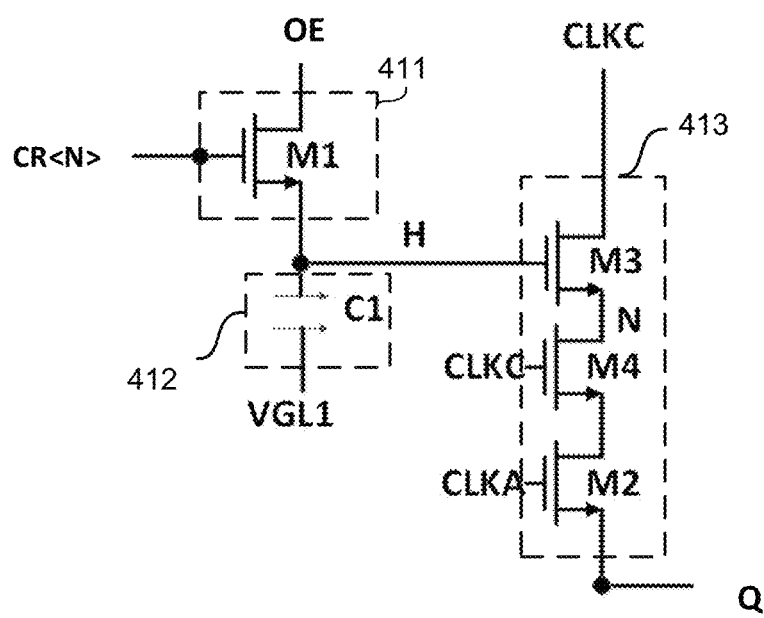
FIG. 5H is an exemplary circuit diagram of a blank-input sub-circuit of the shift-register unit circuit according to an eighth embodiment of the present disclosure.

In another example, referring to FIG. 5B, the first isolation transistor M3 has a first terminal connected to a high voltage signal line VDD. When the blank-control node H is maintained at a turn-on (high) voltage level controlled by the storage sub-circuit, the first isolation transistor M3 is turned on. If the third clock-signal line CLKC supplies a turn-on voltage level signal to turn on the second isolation transistor M4, the turn-on voltage level from VDD can be passed as a blank-output-control signal (or a blank-pull-up signal) to the first node Q.

In some embodiments of cascaded multi-stage shift-register unit circuits, an odd stage and an even stage are alternately connected. FIG. 5A through FIG. 5H show a connection structure corresponding to each of odd stages of shift-register unit circuits. If the second clock-signal line CLKB and the third clock-signal line CLKC in those circuits shown in FIG. 5A through FIG. 5H are interchanged, the corresponding connection structure is just fitted to each of even stages of shift-register unit circuits.

In some embodiments, the isolation sub-circuit 413 is configured to output a turn-on voltage stored at the blank-control node H as the blank-output-control signal (or blank-pull-up signal) to the first node Q. For example, referring to FIG. 5F, the isolation sub-circuit 413 includes a first isolation transistor M3 having a first terminal connected to the blank-control node H, a second terminal connected to the first node Q, and a control terminal connected to the third clock-signal line CLKC. When the third clock-signal line CLKC inputs a turn-on voltage level signal, the first isolation transistor M3 is turned on, and configured to input a blank-control signal at the turn-on voltage stored at the blank-control node H as the blank-output-control signal to the first node Q.

In some embodiments, the isolation sub-circuit 413 also includes a third isolation transistor M2 as shown in FIG. 5A. The third isolation transistor M2 is connected in series with the first isolation transistor M3 and the second isolation transistor M4. The third isolation transistor M2 has its control terminal connected to a first clock-signal line CLKA. The first clock-signal line provides a first clock signal for preventing a first node in a next stage shift-register unit circuit from being falsely written with a high voltage level to cause abnormal output due to a second clock signal from the second clock-signal line CLKB being at a high voltage level. The third isolation transistor M2 can be connected between M3 and M4. The third isolation transistor M2 can also be followed with M3 and M4 in series.

As described above, the charging sub-circuit 411, the storage sub-circuit 412, and the isolation sub-circuit 413 can each have a plurality of different connection modes. Although only eight exemplary connections are illustrated in FIGS. 5A-5H, those skilled in the art will appreciate that the aforementioned charging sub-circuit 411, storage sub-circuit 412, and isolation sub-circuit 413 with arbitrary connection variations can be utilized in accordance with the principles of the present disclosure described above.

Figure 6:
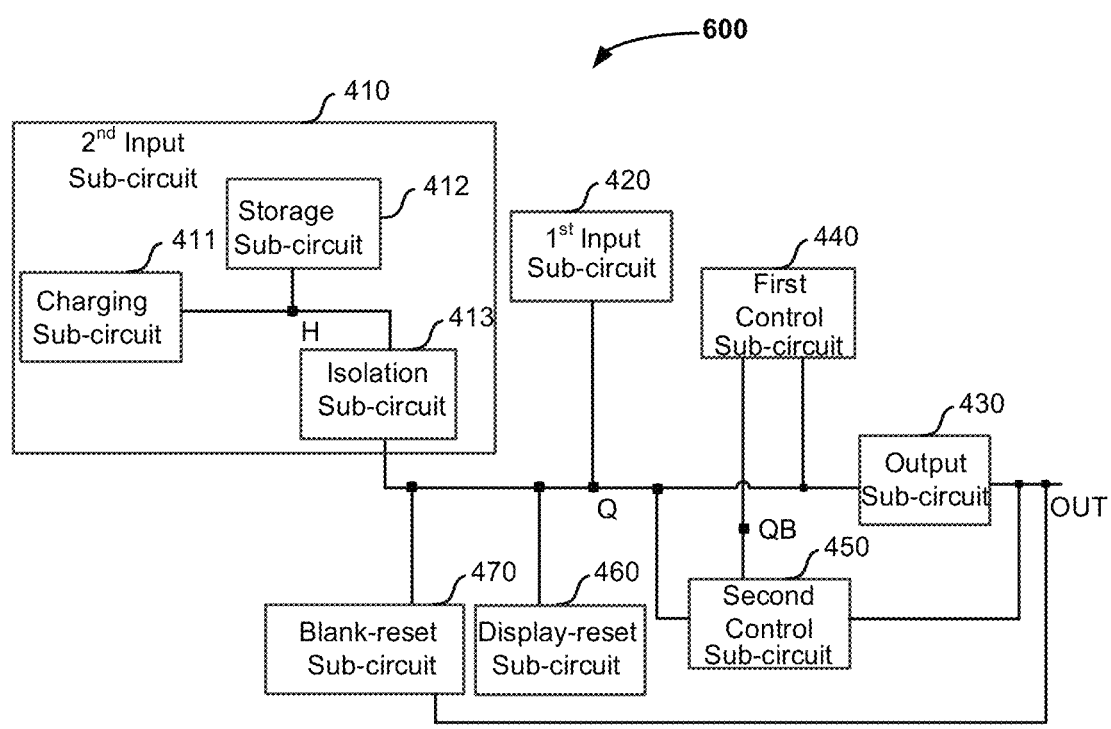
FIG. 6 is a block diagram of a shift-register unit circuit according to another embodiment of the present disclosure.

FIG. 6 is a block diagram of a shift-register unit circuit according to yet another embodiment of the present disclosure. Referring to FIG. 6, the shift-register unit circuit 600 includes a blank-input sub-circuit 410, a display-input sub-circuit 420, an output sub-circuit 430, a first control sub-circuit 440, a second control sub-circuit 450, a display-reset sub-circuit 460, and a blank-reset sub-circuit 470. The blank-input sub-circuit 410, the display-input sub-circuit 420, and the output sub-circuit 430 can be same one or variation of the blank-input sub-circuit 110/410 selected from those shown in FIG. 1 through FIG. 5H, or same one or variation of the display-input sub-circuit 120/420 thereof, or same one or variation of the output sub-circuit 130/430 thereof.

Referring to FIG. 6, the shift-register unit circuit 600 includes a first control sub-circuit 440 configured to control voltage level of a second node QB based on the first node Q. For example, when the first node Q is at a turn-on voltage level, the first control sub-circuit 440 can pull down the voltage level of the second node QB to a turn-off voltage level under control of the first node. In another example, when the first node is at a turn-off voltage level, the first control sub-circuit 440 is able to pull up the voltage level of the second node QB to a turn-on voltage level under control of the first node.

The shift-register unit circuit 600 also includes a second control sub-circuit 450 configured to pull down the first node Q and the output terminal OUT to non-working voltage level under control of the second node QB. For example, when the output terminal OUT outputs no signal, it is configured to control the voltage level of the second node QB to pull down the first node Q and the output terminal to non-working voltage level so that noises at the output terminal of the shift-register unit circuit can be reduced.

In some embodiments, the shift-register unit circuit 600 also includes a display-reset sub-circuit 460 configured to reset the first node Q under control of a display-reset signal. In some embodiments, when the shift-register unit circuit 600 outputs a display-output signal in a display period of one cycle of displaying one frame of image, and right before an end of the display period, it is configured to receive the display-reset signal by the display-reset sub-circuit 460 so as to pull down voltage level of the first node Q to a turn-off (low) voltage level.

In some embodiments, the shift-register unit circuit 600 also includes a blank-reset sub-circuit 470 configured to reset the first node Q and/or the output terminal OUT before an end of a blank period in one cycle of displaying one frame of image. In some embodiments, after the shift-register unit circuit 600 outputs a blank-output signal during a blank period of the cycle, and right before an end of the blank period, it is configured to receive the blank-reset signal by the blank-reset sub-circuit 470 so as to pull down voltage level of the first node Q to a turn-off (low) voltage level. In some other embodiments, it is also configured to use the blank-reset sub-circuit 470 to pull down voltage level at the output terminal OUT to the turn-off (low) voltage level to reduce noises at the output terminal OUT of the shift-register unit circuit. Optionally, one or more of the first control sub-circuit 440, the second control sub-circuit 450, the display-reset sub-circuit 460, and the blank-reset sub-circuit 470 can be selected to use or not in use depending on applications. The shift-register unit circuit of the present disclosure can achieve a function of controlling voltage level of a first node respectively by a blank-input sub-circuit and a display-input sub-circuit in different time periods of one cycle of displaying one frame of image. With that, the shift-register unit circuit can achieve a function of using one output unit shared by the blank-input sub-circuit and the display-input sub-circuit to output a hybrid output signal. Additionally, the shift-register unit circuit can control the voltage level of the first node during non-output time periods to reduce noise.

Figure 7:
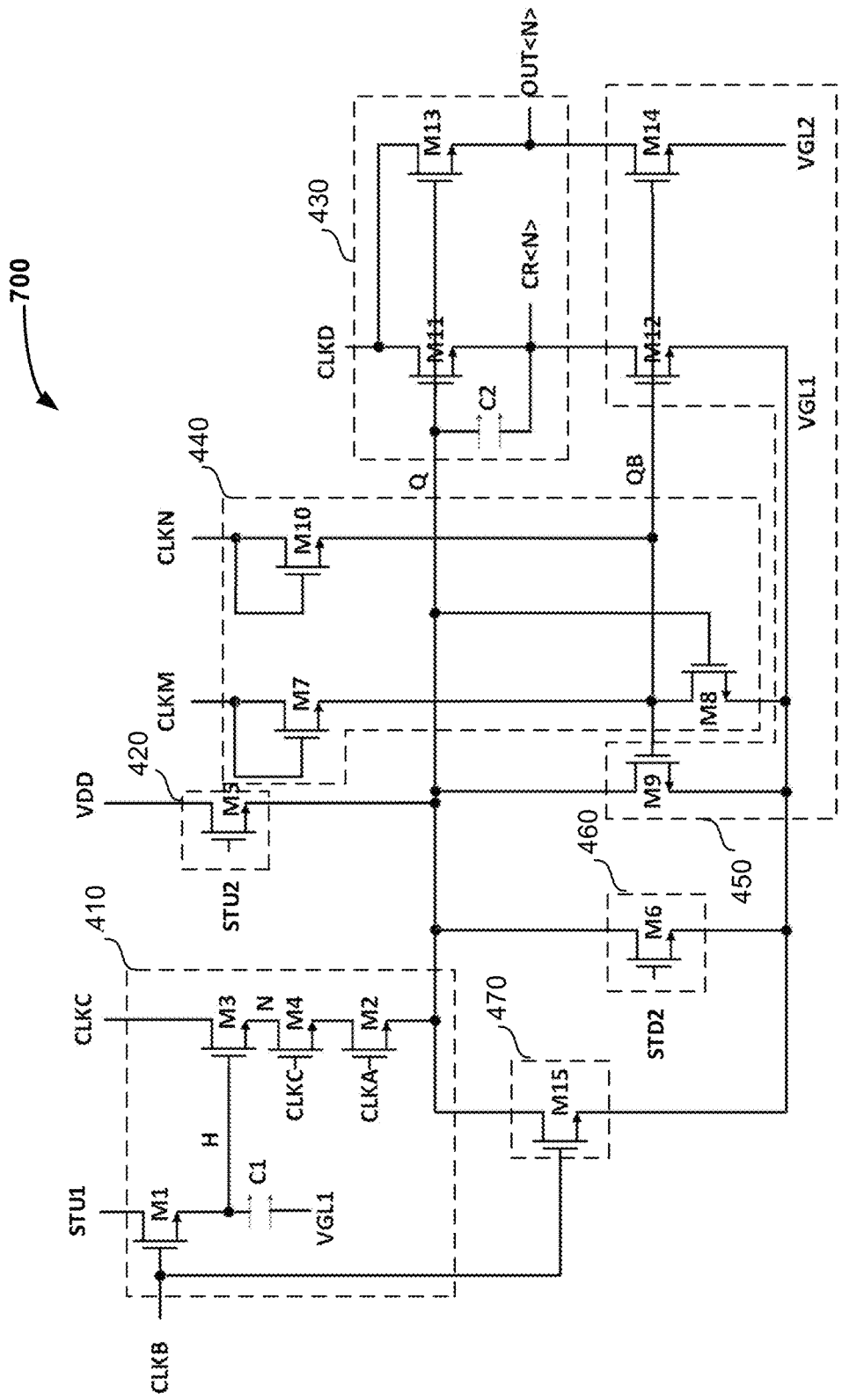
FIG. 7 is an exemplary circuit diagram of a shift-register unit circuit according to a first embodiment of the present disclosure.

FIG. 7 is an exemplary circuit diagram of a shift-register unit circuit according to a first embodiment of the present disclosure. Referring to FIG. 7, the shift-register unit circuit 700 includes a blank-input sub-circuit 410, a display-input sub-circuit 420, and an output sub-circuit 430 substantially the same as those described herein. Additionally, the shift-register unit circuit 700 also includes a first control sub-circuit 440 including a first control transistor M7 with a control terminal and a first terminal commonly connected to a seventh clock-signal line CLKM and a second terminal connected to a second node QB. During its operation of the shift-register unit circuit 700, the seventh clock-signal line CLKM can provide a constant high-voltage (turn-on) signal. The first control sub-circuit 440 further includes a second control transistor M8 with a first terminal connected to the second node QB, a second terminal connected to a first signal line VGL1, and a control terminal connected to the first node Q. The first signal line VGL1 is optionally to input a low-voltage (turn-off) signal. When the first node Q is at a high voltage level, the second control transistor M8 is turned on. By designing a proper channel width-to-length ratio for each of the first control transistor M7 and the second control transistor M8, the voltage level of the second node QB can be pulled down to a low voltage level. When the first node Q is at a low voltage level, the second control transistor M8 is turned off. At this time, the high-voltage signal inputted to the seventh clock-signal line CLKM is passed to the second node QB, which pulls up the second node QB to a high voltage (turn-on) level.

In the embodiment, the seventh clock-signal line CLKM always supplies a high voltage signal during the operation of the shift-register unit circuit (700). Therefore, the first control transistor M7 is always in a conduction state, i.e., a turn-on state. In order to avoid drift in transistor properties due to long-time in conduction state, the first control sub-circuit 440 also includes a third control transistor M10. The third control transistor M10 has a first terminal and a control terminal commonly connected to an eighth clock-signal line CLKN, and has a second terminal connected to the second node QB. As seen in FIG. 7, the third control transistor M10 and the first control transistor M7 have a same structure in circuitry connection. During the operation, they can be used alternately in time to achieve functions of the first control sub-circuit 440. For example, when the seventh clock-signal line CLKM inputs a high voltage signal, the eighth clock-signal line inputs a low voltage signal. Thus, the first control transistor M7 is turned on while the third control transistor M10 is turned off. Alternately in another time, when the seventh clock-signal line CLKM inputs a low voltage signal, the eighth clock-signal line inputs a high voltage signal. Thus at this time, the first control transistor M7 is turned off while the third control transistor M10 is turned on.

Referring to FIG. 7, the second control sub-circuit 450 includes a first pull-down transistor M9 with a first terminal connected to the first node Q, a second terminal connected to the first signal line VGL1, and a control terminal connected to the second node QB. The first signal line VGL1 is set to input a low-voltage turn-off signal. When the second node QB is at a high voltage (turn-on) level, the first pull-down transistor M9 is turned on to pull down a voltage level of the first node Q to a low voltage level.

The second control sub-circuit 450 also includes a second pull-down transistor M12. The second pull-down transistor M12 has a first terminal connected to a first output terminal CR, a second terminal connected to the first signal line VGL1, and a control terminal connected to the second node QB. Again, the first signal line VGL1 is set to input a low voltage (turn-off) signal. When the second node is at a high voltage level, the second pull-down transistor M12 is turned on to pull down a voltage level of the first output terminal CR to a low voltage level.

When the output sub-circuit has multiple output terminals, the second control sub-circuit further can include more pull-down transistors. Referring to FIG. 7, the second control sub-circuit 450 includes a third pull-down transistor M14 having a first terminal connected to a second output terminal OUT, a second terminal connected to a second signal line VGL2, and a control terminal connected to the second node QB. The second signal line VGL2 is set to input a low voltage (turn-off) signal. When the second node QB is set to a high voltage level, the third pull-down transistor M14 is turned on to pull down the second output terminal OUT to a low voltage level.

Referring to FIG. 7, the display-reset sub-circuit 460 includes a display-reset transistor M6 having a first terminal connected to the first node Q, a second terminal connected to the first signal line VGL1, and a control terminal connected to a display-reset terminal STD2. Here, the first signal line VGL1 is set to load a low voltage signal. In a display period of one cycle of displaying one frame of image, when the display-reset terminal provides a high-voltage (turn-on) signal, the display-reset transistor M6 is turned on to pull down the first node Q to a low voltage level.

Referring to FIG. 7, the blank-reset sub-circuit 470 includes a first blank-reset transistor M15 having a first terminal connected to the first node Q, a second terminal connected to the first signal line VGL1, and a control terminal connected to a blank-reset terminal. Here, the first signal line VGL1 is set to load a low voltage turn-off signal. Before an end of a blank period of one cycle of displaying one frame of image, the blank-reset terminal can provide a high-voltage turn-on signal to make the first blank-reset transistor being turned on and to pull down the first node Q to a low voltage level. In some embodiments, the blank-reset sub-circuit 470 also includes a second blank-reset transistor (not shown in FIG. 7). Optionally, the second blank-reset transistor has a first terminal connected to a second clock-signal line CLKB, a second terminal connected to the first signal line VGL1, and a control terminal connected to the blank-reset terminal. Optionally, referring to FIG. 7, the blank-reset terminal is connected to the second clock-signal line CLKB. In this case, a blank-reset signal and a second clock signal can be provided from a same signal line. Optionally, the blank-reset signal can be provided by any signal lines shown in the figure or other separate signal line. For example, if a charging transistor receives a random input signal, the blank-reset terminal can be configured to be provided via a blank-reset control line TRST which can be configured to load a blank-reset signal before an end of one blank period of one cycle. This blank-reset signal is used to reset a voltage level of the first node Q so as to prevent generation of noise pulses at first node Q of other stages of shift-register unit circuits cascaded in a same series of gate-driving circuit.

Note, the first signal line VGL1 and the second signal line VGL2 shown in FIG. 7 can be a same signal line or two different signal lines. The signal lines can be arbitrarily set in the shift-register unit circuit in order to achieve proper operation or control of the transistors in the shift-register unit circuit.

Figure 8:
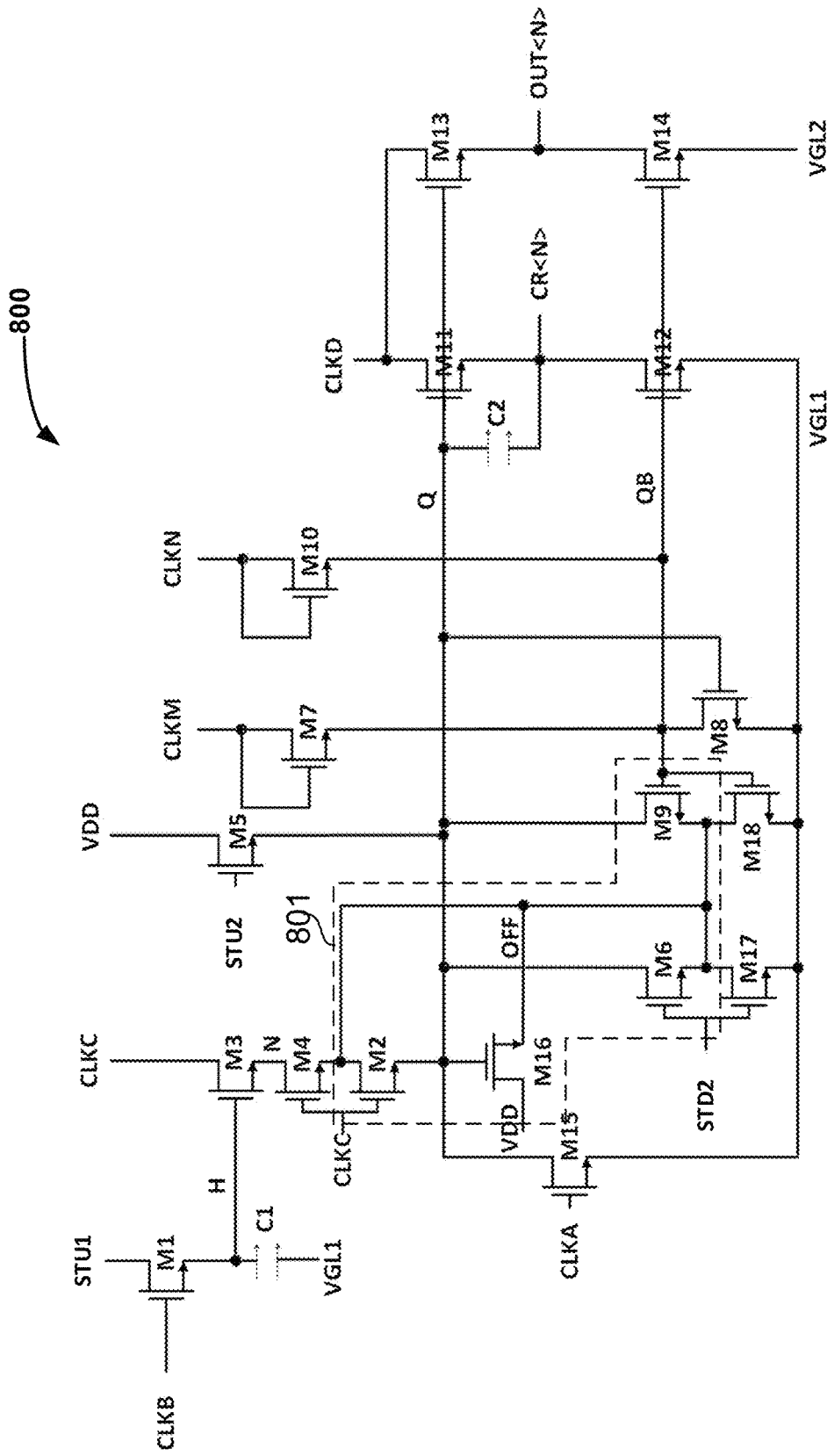
FIG. 8 is an exemplary circuit diagram of a shift-register unit circuit according to a second embodiment of the present disclosure.

FIG. 8 shows an exemplary circuit diagram of a shift-register unit circuit according to a second embodiment of the present disclosure. As shown in the shift-register unit circuit of the present disclosure, it is possible to utilize a first capacitor C1 to maintain a voltage level at the blank-control node H and utilize a second capacitor C2 to maintain a voltage level at the first node Q. When the first node Q and/or the blank-control node H are maintained at a turn-on voltage level, for some transistors having their first terminals connected to the first node Q and/or the blank-control node H and their second terminals connected to a signal line provided with a turn-off voltage level, there might be an issue of current leak due to the voltage difference between the first terminals and the respective second terminals even when their control terminals of the respective transistors is loaded with a turn-off signal. The current leak issue will cause the shift-register unit circuit performance degradation of maintaining voltage levels at the first node Q and/or the blank-control node H.

For example for the blank-control node H, referring to FIG. 5A, the charging transistor M1 has a first terminal connected to a blank-input-signal line STU1, a second terminal connected to the blank-control node H. When the blank-control node H is at a turn-on voltage level and the blank-input-signal line is loaded with a blank-input signal at a turn-off voltage level, the charging transistor M1 can have current leak problem. Also, for the first node Q, when the first node Q is set to a turn-on voltage level, the second signal line VGL2 is loaded with a low voltage signal, a current leak may occur at the transistor M6 and transistor M9.

For preventing from the current leak problem, a shift-register unit circuit with an anti-leak function is provided. Referring to FIG. 8, the shift-register unit circuit 800 includes an anti-leak sub-circuit 801. For each of those transistors that individually connected to the first node Q, the anti-leak sub-circuit 801 can include a first anti-leak transistor M16 and one or more second anti-leak transistors M2, M6, M9. All the second anti-leak transistors (M2, M6, M9) have a first terminal connected to the first node Q, a second terminal connected to an anti-leak connection point OFF. For example, the first anti-leak transistor M16 has its first terminal connected to one terminal of all second anti-leak transistors (M2, M6, M9) and its second terminal connected to a high-voltage signal line VDD. The control terminal of M16 is connected to the first node Q. When the first node is set to a turn-on voltage level, the first anti-leak transistor M16 is turned on to pass a high-voltage signal from the high-voltage signal line VDD to the first terminal of the second anti-leak transistor M2. Both the first terminal and the second terminal of the second anti-leak transistor M2 are set at high voltage level states, thereby preventing charges at the first node Q to leak through the second anti-leak transistor M2. At this time, since the control terminal of the second anti-leak transistor M2 is connected to a control terminal of a second isolation transistor M4, the combination of the second anti-leak transistor M2 and the second isolation transistor M4 can achieve the same isolation function originally given by the isolation transistor as well as achieve a function of anti-leak.

Similarly, a combination of transistors M6 and M17 and another combination of transistors M9 and M18, referring to FIG. 7, also can achieve the functions of M6 and M9 in the corresponding shift-register unit circuit 700 and provide further an anti-leak function.

Figure 9:
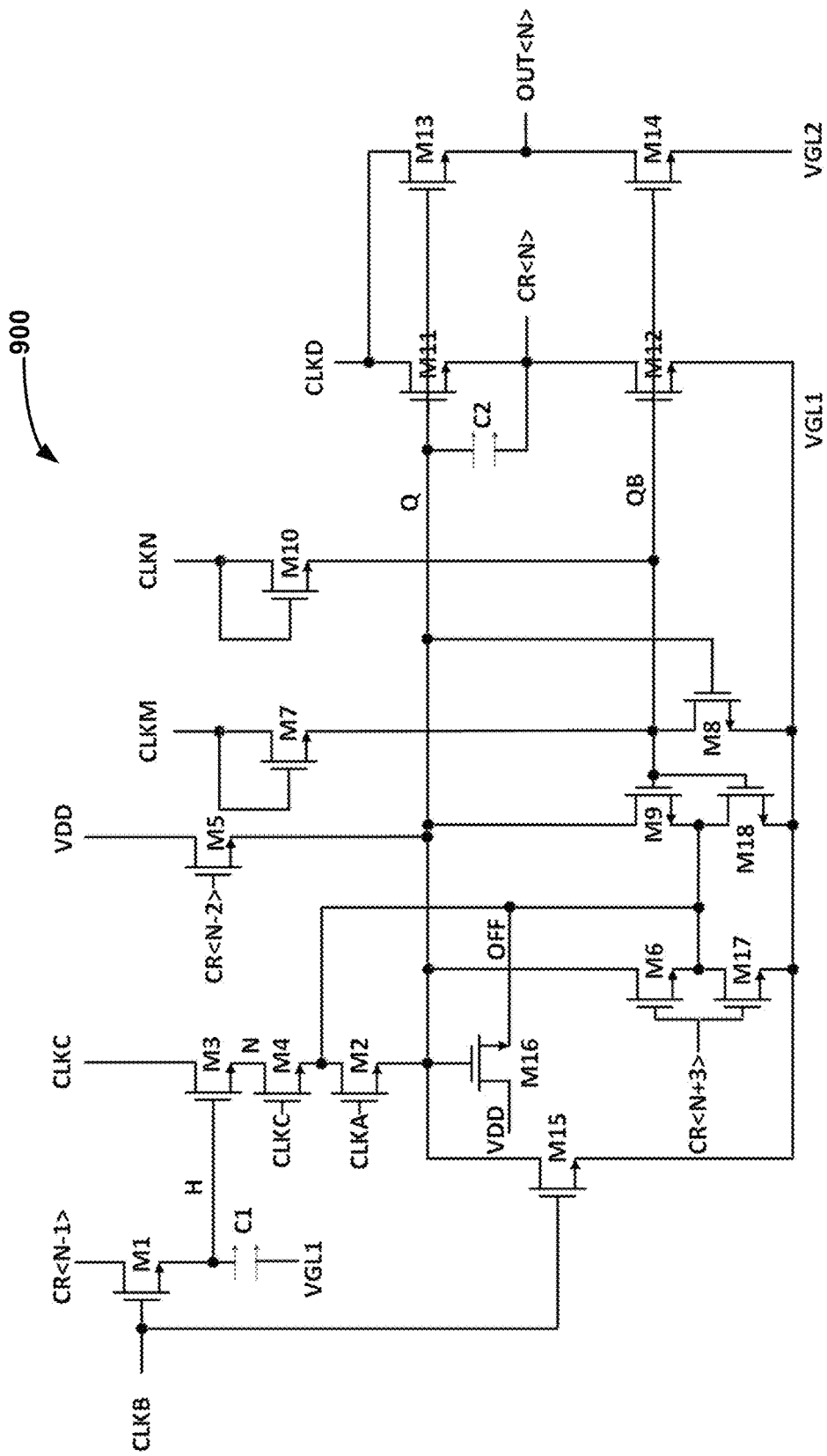
FIG. 9 is an exemplary circuit diagram of a shift-register unit circuit according to a third embodiment of the present disclosure.

FIG. 9 shows an exemplary circuit diagram of a shift-register unit circuit according to a third embodiment of the present disclosure. Referring to FIG. 9, the second anti-leak transistor M2 in the shift-register unit circuit 900 has a control terminal connected to a first clock-signal line CLKA, not the third clock-signal line CLKC as shown in FIG. 8. Additionally, a first clock signal from the first clock-signal line CLKA is loaded with a low voltage level that is configured to be even lower than the turn-off voltage level provided in the third clock-signal line CLKC. By setting in this way, possible current leaking through the second anti-leak transistor M2 induced by a bootstrap-effect-caused voltage rise at the first node can be prevented. In another embodiment, the second isolation transistor M4 can have its control terminal configured to connect with the first clock-signal line CLKA. In another embodiment, the second anti-leak transistor M2 can be configured to connect its control terminal to the third clock-signal line CLKC and the second isolation transistor M4 can be configured to connect its control terminal to the first clock-signal line CLKA to achieve a function of anti-leak in the shift-register unit circuit 900.

Figure 10:
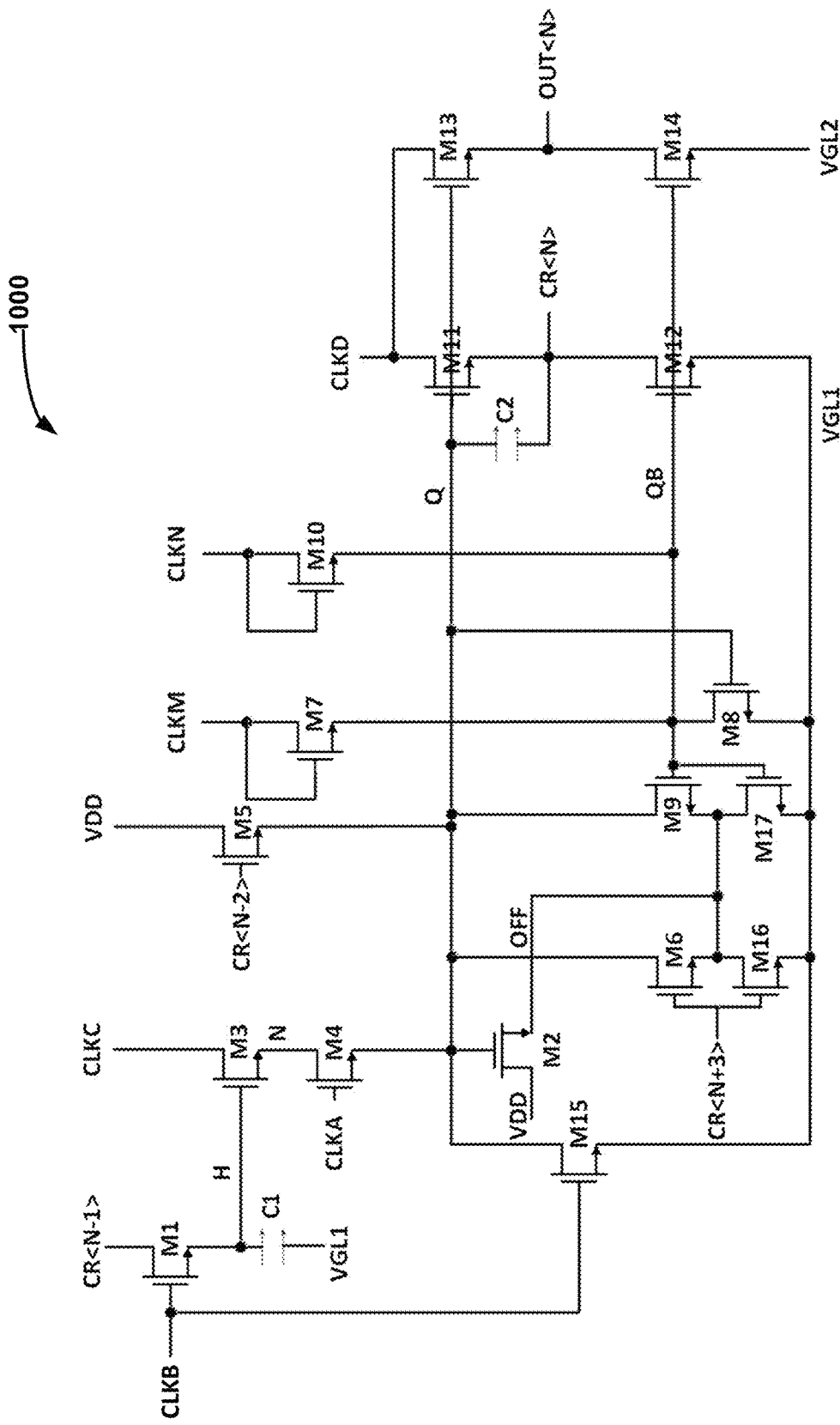
FIG. 10 is an exemplary circuit diagram of a shift-register unit circuit according to a fourth embodiment of the present disclosure.

FIG. 10 shows an exemplary circuit diagram of a shift-register unit circuit according to a fourth embodiment of the present disclosure. Referring to FIG. 10, comparing with the shift-register unit circuit 900 shown in FIG. 9, the shift-register unit circuit 1000 can save an anti-leak transistor for the second isolation transistor M4, instead, the control terminal of the second isolation transistor M4 is connected to the first clock-signal line CLKA. Additionally, a first clock signal provided to the first clock-signal line CLKA is set to be lower than a third clock signal provided to the third clock-signal line CLKC. Under this configuration and voltage setting, it is able to prevent current leaking problem due to voltage rise induced by bootstrap effect at the first node Q.

Figure 11A:
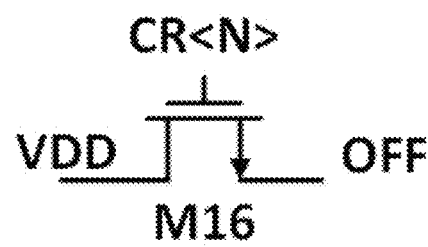
FIG. 11A through FIG. 11D show exemplary circuit diagrams of an anti-leak sub-circuit according to some embodiments of the present disclosure.
Figure 11B:
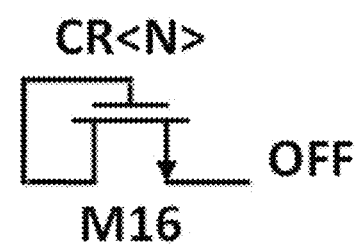
Figure 11C:
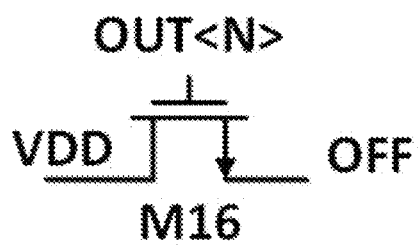
Figure 11D:
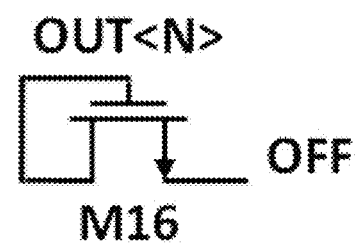

FIG. 11A through FIG. 11D show exemplary circuit diagrams of an anti-leak sub-circuit according to some embodiments of the present disclosure. Referring to FIG. 11A and FIG. 11C, a first anti-leak transistor has a control terminal connected to an output terminal CR<N> or OUT<N> of a current-stage shift-register unit circuit. A first terminal of the first anti-leak transistor is connected to a high voltage signal line VDD. A second terminal of the first anti-leak transistor is connected to an anti-leak connection point OFF. Referring to FIG. 11B and FIG. 11D, a first anti-leak transistor has a control terminal and a first terminal commonly connected to an output terminal CR<N> or OUT<N>. A second terminal of the first anti-leak transistor is connected to an anti-leak connection point OFF.

The first anti-leak transistor M16 shown in FIG. 11B and FIG. 11D can be turned on when the output sub-circuit has an output signal, then be able to prevent current leaking from the first node Q.

The display-input sub-circuit shown in FIG. 11B and FIG. 11D can be used, when the first anti-leak transistor M16 is turned on by turn-on voltages at the output terminal CR<N> or OUT<N>, to prevent glitches in the output signal from being generated due to capacitance coupling in the circuit.

Figure 12:
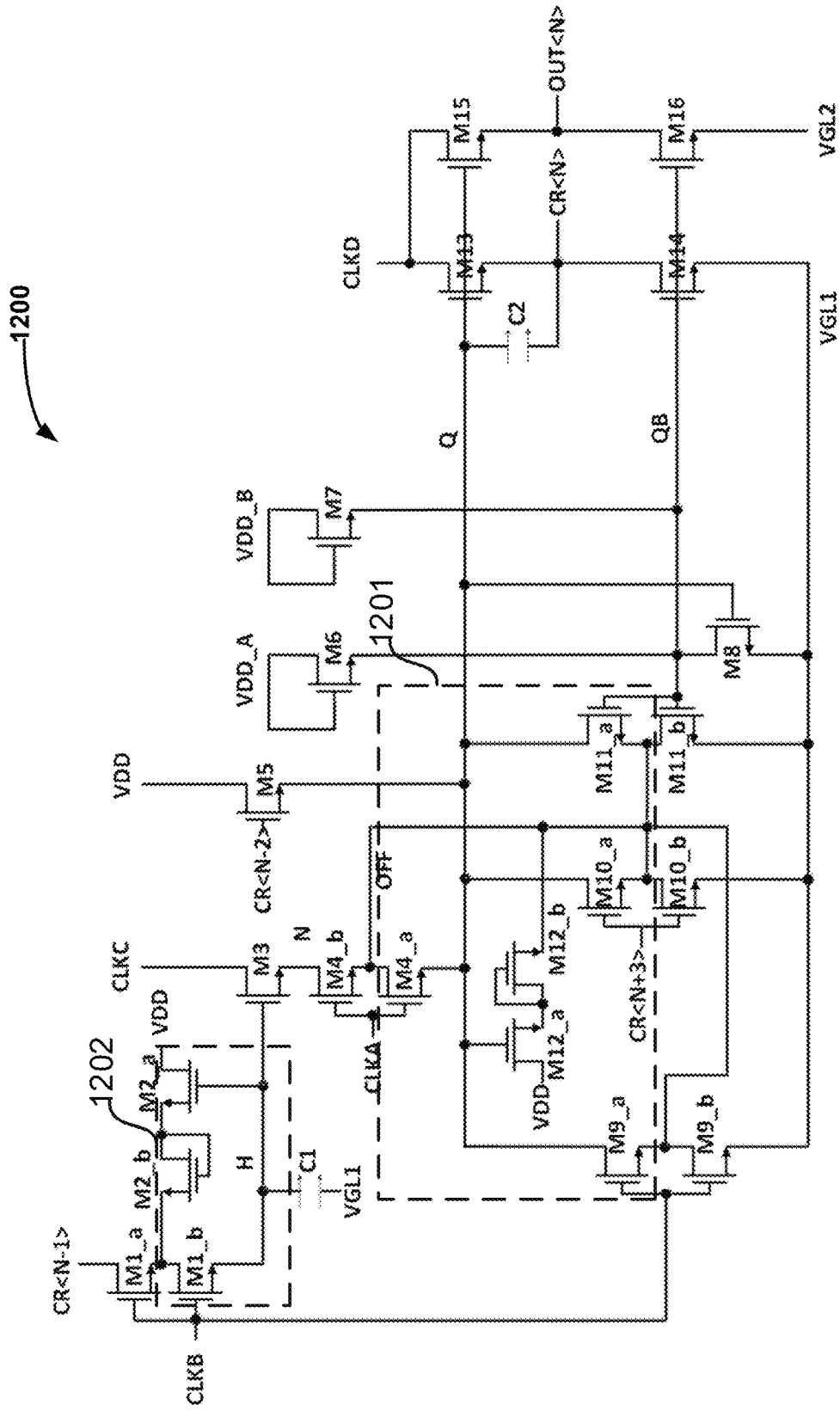
FIG. 12 is an exemplary circuit diagram of a shift-register unit circuit according to a fifth embodiment of the present disclosure.

FIG. 12 shows an exemplary circuit diagram of a shift-register unit circuit according to a fifth embodiment of the present disclosure. Referring to FIG. 12, the shift-register unit circuit 1200 can also be configured to set an anti-leak circuitry structure in the charging sub-circuit. In some embodiments, the shift-register unit circuit 1200 includes a first anti-leak sub-circuit 1201 including transistors M9_a, M10_a, M11_a, and M4_a. The functions of these transistors are similar to those transistors M6 and M9 in FIG. 10. Additionally, the first anti-leak transistor M16 shown in FIG. 10 is replaced by transistors M12_a and M12_b in FIG. 12. The transistor M12_a has a control terminal connected to the first node Q, a first terminal connected to the high-voltage signal line VDD, and a second terminal connected to a first terminal and a control terminal of transistor M12_b. The transistor M12_b also has a second terminal connected to an anti-leak connection point OFF.

The shift-register unit circuit 1200 further includes a second anti-leak sub-circuit 1202 including a transistor M2_a, a transistor M2_b, and a transistor M1_b. The functions and connections of the transistors M2_a and M2_b are the same as the transistors M12_a and M12_b in the first anti-leak sub-circuit 1201. The transistor M1_b has same functions as transistors M9_a, M10_a, M11_a, and M4_a. Using the second anti-leak sub-circuit 1202, the current-leaking from the blank-control node H at high-voltage level via the charging transistor can be prevented. In general, the anti-leak sub-circuit provided in the shift-register unit circuit of the present disclosure can prevent current-leaking due to existence of different voltage levels between the first node Q and the blank-control node H.

In some embodiments, the capacitors used in the shift-register unit circuit, like the first capacitor C1 and the second capacitor C2 can be implemented directly with a stand-alone capacitor or can be parasitic capacitors associated with some transistors.

Figure 13:
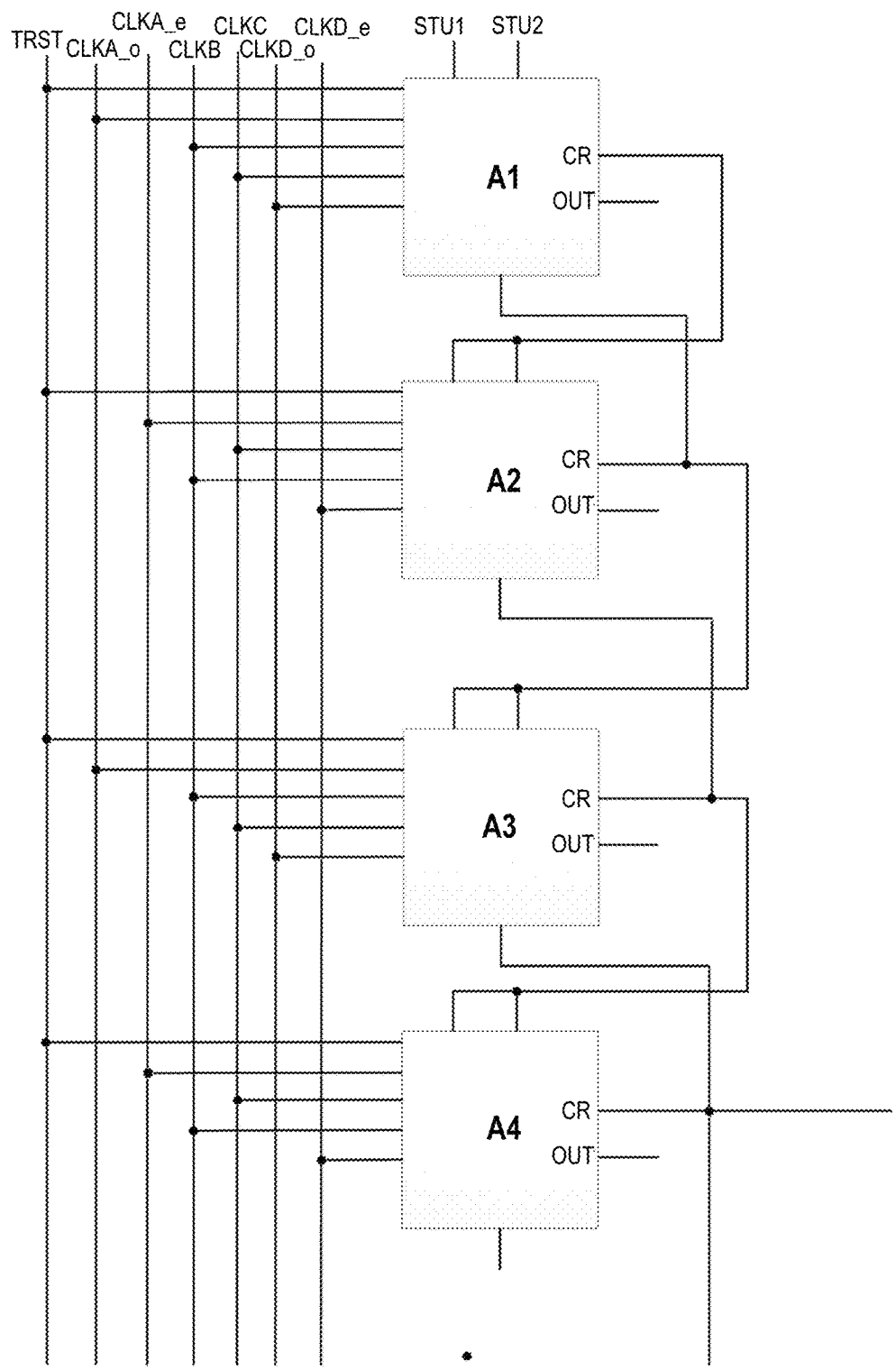
FIG. 13 is a schematic block diagram of a gate-driving circuit according to a first embodiment of the present disclosure.

In another aspect of the present disclosure, a gate-driving circuit is provided. FIG. 13 is a schematic block diagram of a gate-driving circuit according to a first embodiment of the present disclosure. Referring to FIG. 13, the gate-driving circuit includes multiple shift-register unit circuit cascaded in multiple serial stages. Optionally, each stage of shift-register unit circuit can be substantially the same or a variation of circuitry structures of the shift-register unit circuits disclosed in FIG. 1 through FIG. 12.

Based on an N-stages cascaded shift-register unit circuits in the gate-driving circuit of FIG. 13, an i-th stage shift-register unit circuit has a display input terminal STU2 and a blank-input terminal STU1, both being connected to an output terminal CR of a previous (i−1)-th stage shift-register unit circuit. The i-th stage shift-register unit circuit has an output terminal CR connected to a display-reset terminal STD2 of the previous (i−1)-th stage shift-register unit circuit. Here N is an integer greater than 2 and 1<I<N. Specially, the first stage shift-register unit circuit has a display-input terminal STU2 connected directly to a display signal line and a blank-input terminal connected to a blank signal line. The N-th stage shift-register unit circuit has a display-reset terminal STD2 connected to a display-reset signal line.

Additionally, each stage shift-register unit circuit is connected to respective clock-signal lines and signal lines for providing all turn-on voltage signals or turn-off voltage signals just like those shown in FIG. 1 through FIG. 12. Because of many variations of circuitry connections in those figures, FIG. 13 as a simplified schematic diagram does not show other signal lines connected to respective stages of shift-register unit circuits.

Figure 14:
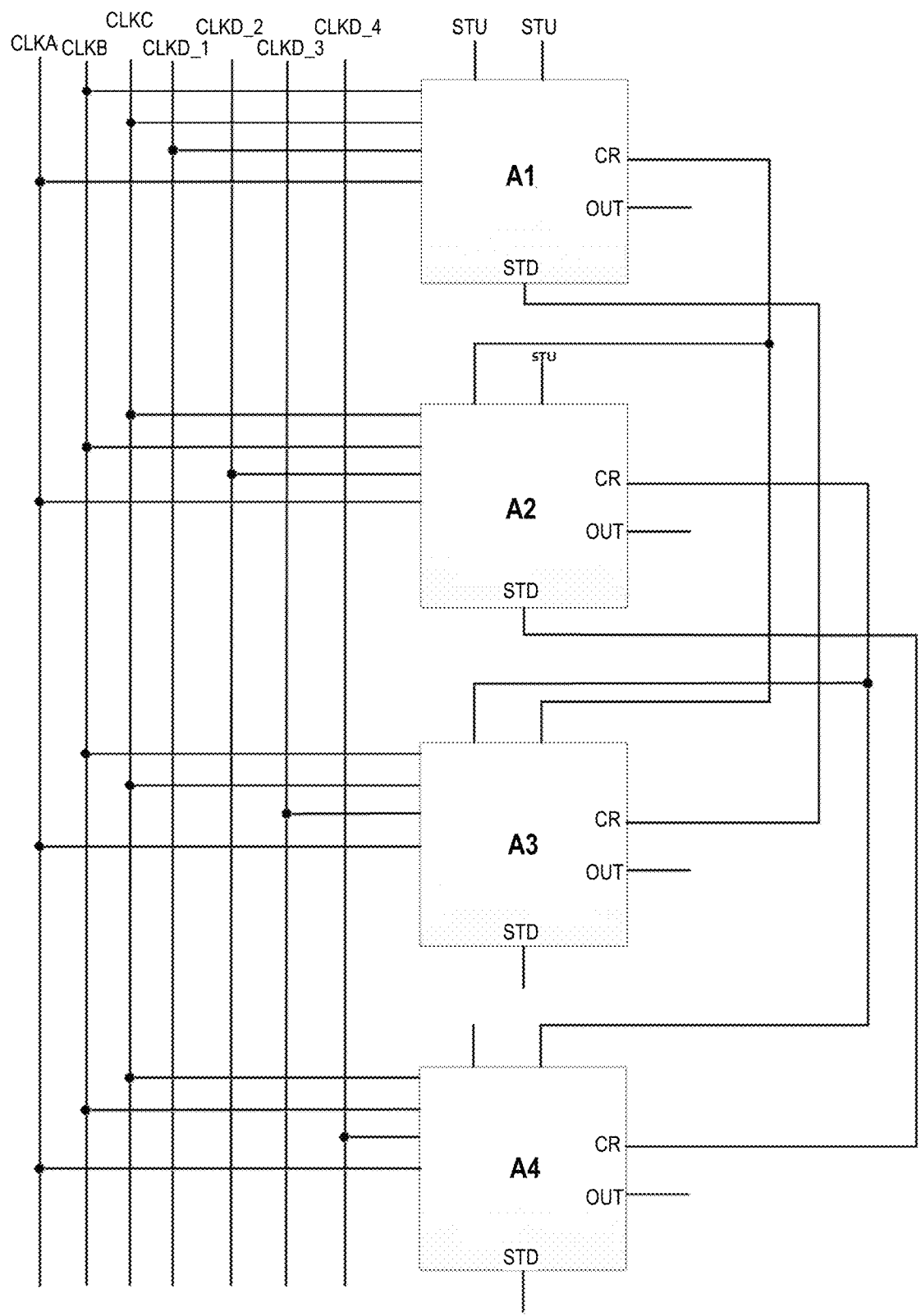
FIG. 14 is a schematic block diagram of a gate-driving circuit according to a second embodiment of the present disclosure.

FIG. 14 is a schematic block diagram of a gate-driving circuit according to a second embodiment of the present disclosure. Referring to FIG. 14, with first four cascaded stages of shift-register unit circuits in a N-stage gate-driving circuit. For 2<i<N−1, the i-th stage shift-register unit circuit includes a blank-input terminal connected to an output terminal of the (i−1)-th stage shift-register unit circuit. The i-th stage shift-register unit circuit also includes a display-input terminal connected to an output terminal of the (i−2)- th stage shift-register unit circuit. The i-th stage shift-register unit circuit further includes a display-reset terminal connected to an output terminal of the (i+2)-th stage shift-register unit circuit. At the same time, the first stage shift-register unit circuit has its blank-input terminal and display-input terminal respectively connected with a blank-input signal line and a first display-input signal line. The second stage shift-register unit circuit has it display-input terminal connected to a second display-input signal line. The (N−1)-th stage shift-register unit circuit has its display-reset terminal connected to a first display-reset signal line. The N-th stage shift-register unit circuit has its display-reset terminal connected to a first display-reset signal line.

Each stage of the multi-stage cascaded shift-register unit circuits is connected respectively to a first clock-signal line CLKA, a second clock-signal line CLKB, a third clock-signal line CLKC, and respective four of fourth clock-signal lines CLKD_1, CLKD_2, CLKD_3, and CLKD_4. In a specific embodiment, the odd-stage shift-register unit circuit and the even-stage shift-register unit circuit have their second clock-signal line CLKB and third clock-signal line CLKC being setup alternately in order. FIG. 14 is merely an example showing different clock-signal lines. There can be many structure variations in respective stages of shift-register unit circuits which may respectively connect to different clock-signal lines depending on specific applications.

Figure 15:
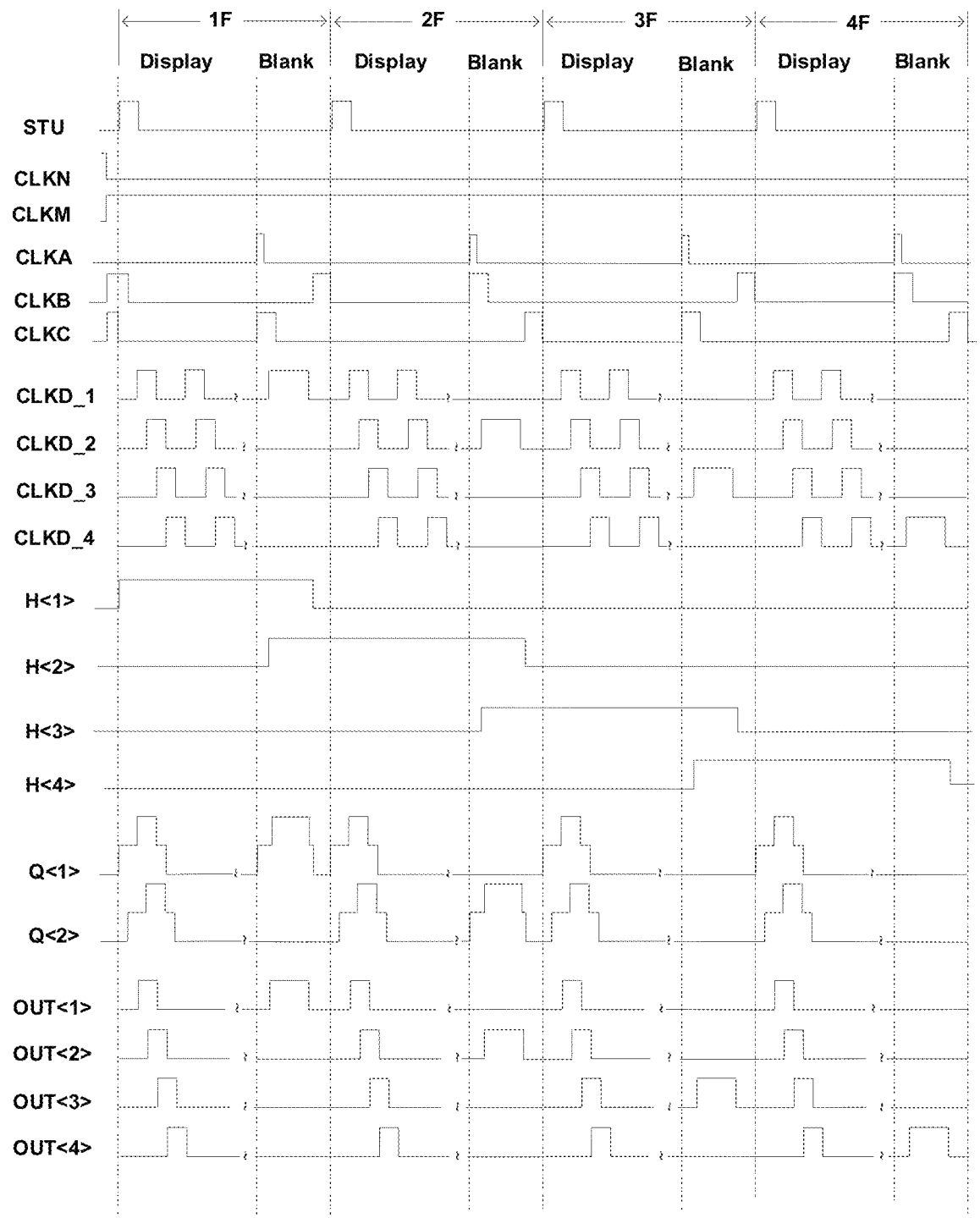
FIG. 15 is a timing diagram of driving a gate-driving circuit according to an embodiment of the present disclosure.

FIG. 15 shows a timing diagram of driving a gate-driving circuit according to an embodiment of the present disclosure. The timing diagram of FIG. 15 can be applied to drive the gate-driving circuit of FIG. 14. The blank-input terminal STU1 and the display-input terminal STU2 all are inputted with an input signal STU.

Referring to FIG. 15, clock-signal lines CLKD_1, CLKD_2, CLKD_3, and CLKD_4 represent four of a fourth clock-signal line connected respectively to a first, second, third, and fourth stage of shift-register unit circuits. Q<1> and Q<2> represent voltages of a first node Q in respective the first and the second stage shift-register unit circuit. OUT<1>, OUT<2>, OUT<3>, and OUT<4> represent voltages at output terminals CR and OUT of respective the first, second, third, and fourth stage shift-register unit circuit. Referring to FIG. 15, before the (current-stage) shift-register unit circuit starts to work, one of a seventh clock-signal line CLKM and an eighth clock-signal line CLKN inputs a high-voltage turn-on signal while the other one inputs a low-voltage turn-off signal. Therefore, a corresponding second node QB is maintained at a high-voltage level and a corresponding first node Q is maintained at a low-voltage level.

Before a display period of one cycle of displaying one frame of image, each of the second clock-signal like CLKB and the third clock-signal line CLKC inputs a high-voltage level turn-on signal. During the display period, the first stage shift-register unit circuit receives a high-voltage signal as display-input from its display-input terminal STU2. At this time, the display-input sub-circuit of the shift-register unit circuit can output a display-pull-up signal to the first node Q based on the display-input signal (at the turn-on voltage level) and pull up the voltage level of the first node Q to a high voltage level. Then, the output sub-circuit receives a high-voltage input signal from the fourth clock-signal CLKD_1 of the first stage shift-register unit circuit. Since output transistors M11 and M13 are turned on by the high voltage at the first node Q, the high-voltage input signal from the fourth clock-signal line can be outputted as output signal to the output terminals CR and OUT_1H through the output transistors M11 and M13.

At the same time, the second clock-signal line CLKB also inputs a high-voltage turn-on signal, a charging transistor of the first stage shift-register unit circuit is turned on by the turn-on signal from the CLKB, and also can pass the high-voltage signal inputted from the input terminal STU to a corresponding blank-control node H to charge the node H.

For the second stage shift-register unit circuit, its second display-input terminal STU2_2 receives the high-voltage input signal STU as a display-input signal. The display-input sub-circuit of the second stage shift-register unit circuit outs a display-pull-up signal to the first node Q based on the display-input signal to pull up the first node Q to a high voltage level. Then, the output sub-circuit of the second stage shift-register unit circuit receives a high-voltage input signal from the fourth clock-signal line CLKD_2. Since the output transistors M11 and M13 are turned on by the high voltage at the first node Q, the high-voltage input signal from the fourth clock-signal line CLKD_2 can be passed through the output transistors M11 and M13 to output at the output terminals CR and OUT_1H.

At this time, the charging transistor of the second stage shift-register unit circuit receives a blank-output signal from the first stage shift-register unit circuit. As mentioned earlier, the odd-stage shift-register unit circuit and the even-stage shift-register unit circuit have their second clock-signal line CLKB and third clock-signal line CLKC being setup alternately in order. Referring to FIG. 15, the third clock-signal line CLKC inputs a high-voltage level signal in the blank period. Under control of the third clock-signal line CLKC and the blank-output signal of the first stage shift-register unit circuit, the blank-control node H of the second stage shift-register unit circuit is pulled up to a high voltage level. And so on, each stage shift-register unit circuit outputs respective blanking-output signal like this.

Referring to FIG. 15, the fourth clock-signal line CLKD_2 that connects to the second stage shift-register unit circuit inputs a second clock signal having a same pulse width as a first clock signal inputted from the fourth clock-signal line CLKD_1 that connects to the first stage shift-register unit circuit. But, the second clock signal has a rising edge delayed by half of the pulse wide compared to the first clock signal. Correspondingly, a display-input signal outputted by the second stage shift-register unit circuit is also delayed by half a pulse width than the display-input signal outputted by the first stage shift-register unit circuit. Thus, a display-output signal of the first stage shift-register unit circuit and a display-output signal of the second stage shift-register unit circuit have 50% pulse overlap.

Because a display-output signal from the first stage shift-register unit circuit can be used as a display-input signal of the third stage shift-register unit circuit, referring to FIG. 14, all odd stages of shift-register unit circuits will output respective display-output signals based on that of the first stage shift-register unit circuit. Similarly, referring to FIG. 14, all even stages of shift-register unit circuits will output respective display-output signals based on that of the first stage shift-register unit circuit with 50% overlap with that of display-output signals of respective previous odd stages of shift-register unit circuits.

In the blank period, referring to FIG. 15, the first clock-signal line CLKA and the third clock-signal line CLKC input high-voltage turn-on signals to use the blank-input sub-circuit to charge the first node Q. Then, the fourth clock-signal line CLKD_1 connected with the first stage shift-register unit circuit inputs a high-voltage turn-on signal and controls the output sub-circuit to output a blank-output signal.

After outputting the blank-output signal and before the end of the blank period, the second clock-signal line CLKB again inputs a high-voltage turn-on signal. Since at this time the blank-input terminals of all odd stages shift-register unit circuits are at a low-voltage level, the charging transistors of all odd stages shift-register unit circuits are turned on by the high voltage signal from the second clock-signal line CLKB to discharge the blank-control node H. Effectively, the blank-control node H is reset (to a low voltage level) before an end of the cycle of displaying one frame of image. This reduces the time of put the blank-control node H at the high-voltage level, avoiding the transistor performance degradation due to being in conduction state for too long.

Similarly, in the blank periods of even cycles (of a series of cycles of displaying frames of images), the third clock-signal line CLKC can be used to input a high voltage turn-on signal after outputting an blank-output signal and before the end of the blank period. At this time, the blank-input terminals of all even stages of shift-register unit circuits are set to a low voltage level. The charging transistors of all even stage shift-register unit circuits are turned on by the high voltage turn-on signal from the third clock-signal line CLKC to discharge the blank-control node H through the respective charging transistors.

Based on the timing diagram provided in FIG. 15, the gate-driving circuit of FIG. 14 is configured to output display-output signals with 50% overlap pulse timing between two neighboring stages shift-register unit circuits. Of course, the gate-driving circuit of the present disclosure can also be configured to output display-output signals with other percentage of overlap in pulse timing depending on applications.

Optionally, the gate-driving circuit based on N-stages cascaded shift-register unit circuits can be divided to multiple groups. For example, the gate-driving circuit includes m groups. Each group includes n shift-register unit circuits with each of them being those shift-register unit circuits described herein. The n shift-register unit circuits of each group are connected stage-by-stage to respective n shift-register unit circuits of a next group. For example, an output terminal of a first shift-register unit circuit of a first group is connected to a display-input terminal of a first shift-register unit circuit of a second group (which can also be viewed as the (n+1)-th stage shift-register unit circuit of the N-stage cascaded shift-register unit circuits). An output of a second shift-register unit circuit of the first group is connected to a display-input terminal of the second shift-register unit circuit of the second group, and so on. As shown above, the gate-driving circuit is configured to have a display-output signal from each stage shift-register unit circuit to be overlapped with another display-output signal of a next stage shift-register unit circuit by 1/n pulse in time-domain.

For example, referring to FIG. 14, the display-output signals of the gate-driving circuit adopt odd-stage cascaded configuration alternately combined with even-stage cascaded configuration to achieve display-output signals from neighboring stages with 50% pulse overlap. In another example, the gate-driving circuit adopting 1, 4, 7, . . . stage cascaded configuration alternately combined with 2, 5, 8, . . . stage cascaded configuration plus 3, 6, 9, . . . stage cascaded configuration, the display-output signals from neighboring stages will have 33% pulse overlap. Of course, other variations and modifications can be implemented to achieve different percentages of pulse overlapping for the display-output signals from neighboring stages of shift-register unit circuits.

Optionally, the blank-input terminals of the N-stage cascaded shift-register unit circuits are also configured to configured via cascaded connections among different stages. For example, an output terminal of the first stage shift-register unit circuit is connected to a blank-input terminal of the second stage shift-register unit circuit. An output terminal of the second stage shift-register unit circuit is connected to a blank-input terminal of the third stage shift-register unit circuit, and so on.

Figure 16:
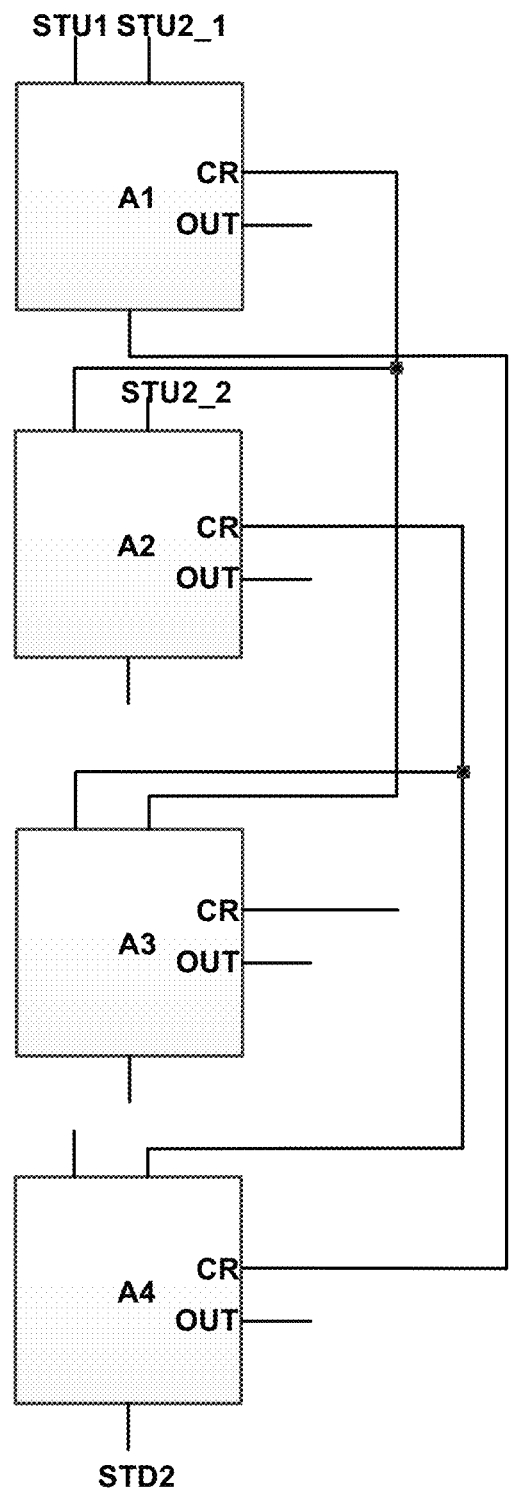
FIG. 16 is a schematic block diagram of a gate-driving circuit according to a third embodiment of the present disclosure.

FIG. 16 is a schematic block diagram of a gate-driving circuit according to a third embodiment of the present disclosure. Referring to FIG. 16, first four stages of shift-register unit circuits of the N-stage cascaded gate-driving circuit are shown. N is a positive integer. For 2<1<N−2, the i-th stage shift-register unit circuit has a blank-input terminal connected to an output terminal of the (i−1)-th stage shift-register unit circuit. The i-th stage shift-register unit circuit has a display-input terminal connected to an output terminal of the (i−2)-th stage shift-register unit circuit. The i-th stage shift-register unit circuit has a display-reset terminal connected to an output terminal of the (i+3)-th stage shift-register unit circuit. At the same time, the first stage shift-register unit circuit has a blank-input terminal and a display-input terminal respectively connected to a blank-input signal line and a first display-input signal line. The second stage shift-register unit circuit has a display-input terminal connected to a second display-input signal line. The (N−2)-th stage shift-register unit circuit has a display-reset terminal connected to a first display-reset signal line. The (N−1)-th stage shift-register unit circuit has a display-reset terminal connected to a second display-reset signal line. The N-th stage shift-register unit circuit has a display-reset terminal connected to a third display-reset signal line.

The gate-driving circuit of FIG. 16 has some major differences versus the gate-driving circuit of FIG. 14. In FIG. 14, the i-th stage shift-register unit circuit has an output terminal connected to a display-input terminal of (i+2)-th stage shift-register unit circuit. The (i+2)-th stage shift-register unit circuit has an output terminal connected to the display-reset terminal of the i-th stage shift-register unit circuit.

The output terminal OUT of each shift-register unit circuit is to output a gate-driving signal for driving a pixel circuit. In order to enhance driving capability of the shift-register unit circuit in some conventional approach, an output transistor M13 with large-volume id adopted therein. Accordingly, in a display-reset period of one cycle of displaying one frame of image, the output terminal OUT may accumulate charges which can be reset through a display-reset transistor M14 with relatively large volume. However, based on the gate-driving circuit of the present disclosure, the accumulated charges at the output terminal OUT can be discharged through output transistor M13 without need to be reset through the display-reset transistor M14. Thus, the display-reset transistor M14 can adopt a smaller volume transistor, further reducing the volume of each shift-register unit circuit. Additionally, because that the voltage level of the first node Q can be raised through a bootstrap effect when the output terminal of the output sub-circuit is at a high-voltage level, the current that flows through the output transistor M13 during discharging can be even larger, making the discharging process faster in the shift-register unit circuit according to some embodiments of the present disclosure.

In still another aspect, the present disclosure provides a display apparatus including a gate-driving circuit described herein. Optionally, the display apparatus includes one selected from a smart phone, a tablet computer, a television, a displayer, a notebook computer, a digital-picture frame, a navigator, and any product of component having a display function.

Figure 17:
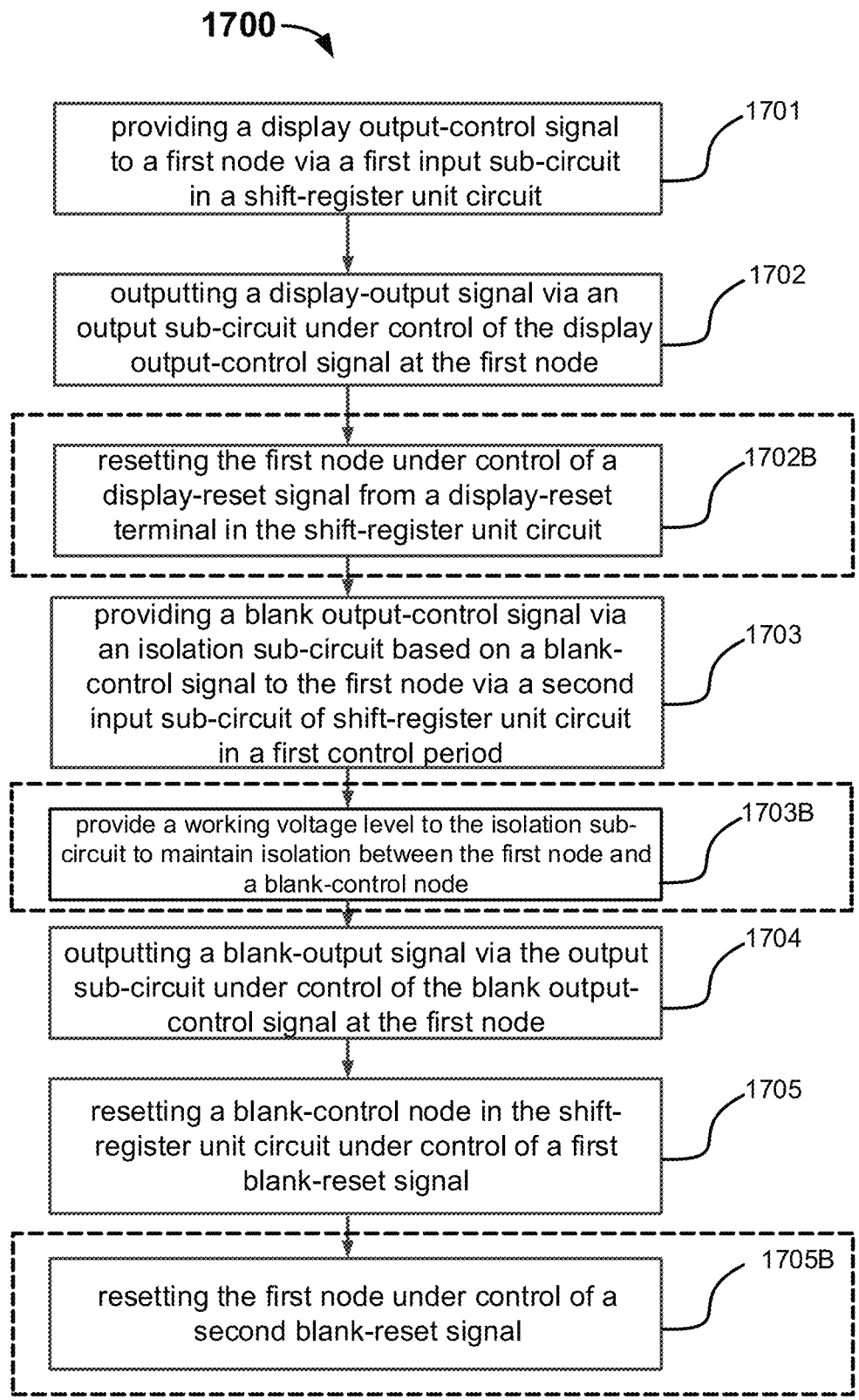
FIG. 17 is a flow chart showing a method for driving a shift-register unit circuit according to an embodiment of the present disclosure.

In yet still another aspect, the present disclosure provides a method for driving a shift-register unit circuit described herein. FIG. 17 shows a flow chart showing a method for driving a shift-register unit circuit according to an embodiment of the present disclosure. Referring to FIG. 17, the driving method 1700 includes a step of 1701: in a control period or a first pull-up period, a display output-control signal is inputted through a display-input sub-circuit to a first node in the shift-register unit circuit. Additionally, the driving method 1700 also includes a step of 1702: in a first output period, a display-output signal is outputted through an output sub-circuit under control of the display output-control signal at the first node. Further, the driving method 1700 includes a step of 1703: in a second control period or a second pull-up period, a blank output-control signal is inputted via an isolation sub-circuit based on a blank-control signal to the first node through a blank-input sub-circuit in the shift-register unit circuit. Furthermore, the driving method 1700 includes a step of 1704: in a second output period, a blank-output signal is outputted via the output sub-circuit under control of the blank-output-control signal at the first node. Moreover, the driving method 1700 includes a step of 1705: in a first blank-reset period, a blank-control node of the shift-register unit circuit is reset under control of a first blank-reset signal.

In some embodiments, the driving method 1700 also includes a step of 1702B: in a display-reset period, the first node in the shift-register unit circuit is reset to a low voltage level under control of a display-reset signal.

In some embodiments, the driving method 1700 also includes a step of 1703B: in the blank period, an anti-leak sub-circuit is to provide a working voltage level to maintain between the first node and the blank-control node.

In some embodiments, the driving method 1700 also includes a step of 1705B: in a first blank-reset period, the blank-control node in the shift-register unit circuit is reset to a low voltage level under control of a first blank-reset signal.

Based on the shift-register unit circuit of the present disclosure, the method is provided to reset the blank-input sub-circuit before an end of a blank period so that the time for transistors in the blank-input sub-circuit in a conduction state can be reduced, so can be transistor performance degradation due to long time stress.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A shift-register unit circuit comprising:
a first input sub-circuit configured to have a display-input terminal to receive a display-input signal, and to provide a display output-control signal to a first node based on the display-input signal;
a second input sub-circuit configured to have a blank-input terminal to receive a blank-input signal for charging a blank-control node, and to provide a blank output-control signal to the first node based on the blank-input signal;
an output sub-circuit configured to have an output terminal to output a hybrid output signal under control of the first node, the hybrid output signal being a display-output signal under control of the display output-control signal and a blank-output signal under control of the blank output-control signal;
a first control sub-circuit, configured to control a voltage level a second node under control of the first node; and
a second control sub-circuit configured to pull down voltage levels of the first node and the output terminal to turn-off voltage levels under control of the second node;
wherein the second input sub-circuit is configured to provide the blank output-control signal to the first node based on a blank-control signal;
the first control sub-circuit comprises a first control transistor and a second control transistor, the first control transistor having a first terminal and a control terminal commonly connected to a first pull-down control-signal line, and a second terminal connected to the second node; the second control transistor having a first terminal connected to the second node, a control terminal connected to the first node, and a second terminal connected to a first signal line providing a turn-off voltage level; and
the second control sub-circuit comprises a first pull-down transistor and a second pull-down transistor, the first pull-down transistor having a first terminal connected to the first node, a control terminal connected to the second node, and a second terminal connected to the first signal line providing the turn-off voltage level; the second pull-down transistor having a first terminal connected to the output terminal, a control terminal connected to the second node, and a second terminal connected to the first signal line providing the turn-off voltage level.

2. The shift-register unit circuit of claim 1, wherein the second input sub-circuit comprises an isolation sub-circuit, wherein the isolation sub-circuit is set between the first node and the blank-control node, and is configured to prevent mutual interference between the first node and the blank-control node.

3. The shift-register unit circuit of claim 2, further comprising an anti-leak sub-circuit configured to provide a working voltage level to an anti-leak connection point.

4. The shift-register unit circuit of claim 3, wherein the anti-leak sub-circuit comprises:
 a first anti-leak transistor having a control terminal connected to the first node, a first terminal connected to a first signal line providing a turn-on voltage level, and a second terminal connected to an anti-leak node, and being configured to provide the turn-on voltage level from the first signal line to the anti-leak node under control of the first node;
 a second anti-leak transistor having a control terminal connected to a first clock-signal line or a third clock-signal line, a first terminal connected to the first node, and a second terminal connected to the anti-leak node which is further connected to the second terminal of a second isolation transistor.

5. The shift-register unit circuit of claim 4, wherein the anti-leak sub-circuit is configured to provide the working voltage level to the second terminal of the second isolation transistor under control of the first node.

6. The shift-register unit circuit of claim 4, wherein the first input sub-circuit further comprises:
 a first display input transistor having a control terminal configured to receive a cascade signal or a display input signal, a first terminal connected to a high-voltage signal line, and a second terminal connected to the first node; and
 a second display input transistor having a control terminal and a first terminal connected to the high-voltage signal line, and a second terminal coupled to the first node.

7. The shift-register unit circuit of claim 3, wherein the anti-leak sub-circuit comprises a third anti-leak transistor and a fourth anti-leak transistor;
 the third anti-leak transistor has a control terminal connected to the first node, a first terminal connected to a high-voltage signal line, and a second terminal connected to a first terminal of the fourth anti-leak transistor; and
 the fourth anti-leak transistor has a second terminal connected to the anti-leak connection point.

8. The shift-register unit circuit of claim 3, wherein the anti-leak sub-circuit comprises a fifth anti-leak transistor, a sixth anti-leak transistor, a seventh anti-leak transistor, and an eighth anti-leak transistor; and
 one terminal of each of the fifth anti-leak transistor, the sixth anti-leak transistor, the seventh anti-leak transistor, and the eighth anti-leak transistor is connected to the anti-leak connection point.

9. The shift-register unit circuit of claim 1, wherein the second input sub-circuit comprises:
 a charging sub-circuit, configured to charge the blank-control node based on the blank-input signal; and
 a storage sub-circuit, configured to have one terminal connected to the blank-control node, and configured to store the blank-control signal based on the blank-input signal.

10. The shift-register unit circuit of claim 9, wherein the charging sub-circuit comprises a charging transistor having a first terminal connected to the blank-input terminal, and a second terminal connected to the blank-control node;
 the storage sub-circuit comprises a first capacitor having a first terminal connected to the blank-control node;
 the second input sub-circuit comprises an isolation sub-circuit; and
 the isolation sub-circuit comprises a first isolation transistor and a second isolation transistor; the first isolation transistor having a first terminal configured to provide a high level voltage to an N point in a blank period of one cycle of displaying one frame of image, a control terminal connected to the blank-control node; the second isolation transistor having a first terminal connected to a second terminal of the first isolation transistor, a second terminal connected to the first node, and a control terminal connected to a third clock-signal line, the N point between the first isolation transistor and the second isolation transistor.

11. The shift-register unit circuit of claim 10, wherein the isolation sub-circuit further comprises a third isolation transistor coupled with the second isolation transistor in series, the third isolation transistor having a control terminal connected to a first clock-signal line or the third clock-signal line.

12. The shift-register unit circuit of claim 1, further comprising a display-input sub-circuit;
 wherein the display-input sub-circuit is configured to, under control of a cascade signal or a display input signal, provide a display output-control signal; and
 the display-input sub-circuit comprises a first display-input transistor having a control terminal configured to receive the cascade signal or the display input signal, a first terminal connected to a high-voltage signal line or the cascade signal, and a second terminal connected to the first node.

13. The shift-register unit circuit of claim 12, wherein the display-input sub-circuit is configured to, under control of the cascade signal or the display input signal, receive a high-voltage signal from the high-voltage signal line; and
 the display-input sub-circuit further comprises a second display-input transistor having a control terminal configured to receive the cascade signal or the display input signal, a first terminal connected to the high-voltage signal line or the display input signal, and a second terminal connected to an anti-leak connection point.

14. The shift-register unit circuit of claim 12, wherein the display-input sub-circuit is configured to, under control of the cascade signal or the display input signal, receive cascade signal; and
 the display-input sub-circuit further comprises a second display-input transistor having a control terminal configured to receive the cascade signal or the display input signal, a first terminal configured to receive the cascade signal, and a second terminal connected to an anti-leak connection point.

15. The shift-register unit circuit of claim 1, further comprising a display-reset sub-circuit configured to reset the first node under control of a display-reset signal provided from a reset-signal line after outputting the display-output signal in a display period of one cycle of displaying one frame of image.

16. The shift-register unit circuit of claim 15, wherein the display-reset sub-circuit comprises a display-reset transistor having a first terminal connected to a first node, a control terminal connected to a display-reset terminal, and a second terminal connected to the first signal line.

17. The shift-register unit circuit of claim 1, wherein the output sub-circuit comprises a first output transistor, a second output transistor, and a third output transistor;
- the first output transistor has a first terminal connected to a fourth clock-signal line, a second terminal connected to a first output terminal, and a control terminal connected to the first node;
- the second output transistor has a first terminal connected to a fifth clock-signal line, a second terminal connected to a second output terminal, and a control terminal connected to the first node;
- the third output transistor has a first terminal connected to a sixth clock-signal line, a second terminal connected to a third output terminal, and a control terminal connected to the first node; and
- the sixth clock-signal line is a clock signal line different from or same as the fifth clock-signal line.

18. A gate-driving circuit comprising N stages of shift-register unit circuits cascaded in series, a respective one of the shift-register unit circuits being same as claim 1;
- wherein a display-input terminal of an i-th stage of shift-register unit circuit is connected to an output terminal of an (i−1)-th stage of shift-register unit circuit, wherein N is an integer greater than 2 and $1 < i \leq N$;
- a display-input terminal of a first stage of shift-register unit circuit is connected to a display-signal line; and
- a blank-input terminal of the first stage of shift-register unit circuit is connected to a blank-signal line.

19. A display apparatus comprising the gate-driving circuit of claim 18 and a display panel connected to the gate-driving circuit.

20. A method of driving the shift-register unit circuit of claim 1, the method comprising:
- in a display period of one cycle of displaying one frame of image,
  - providing a display output-control signal to a first node in the shift-register unit circuit via a first input sub-circuit thereof in a first control period;
  - outputting a display-output signal via an output sub-circuit thereof under control of the display output-control signal at the first node in a first output period;
- in a blank period of the one cycle of displaying one frame of image,
  - providing a blank output-control signal via a second input sub-circuit to the first node via a second input sub-circuit of shift-register unit circuit in a second control period; and
  - outputting a blank-output signal via the output sub-circuit under control of the first node in a second output period.

* * * * *